(12) United States Patent
Demura et al.

(10) Patent No.: US 12,097,541 B2
(45) Date of Patent: Sep. 24, 2024

(54) SUBSTRATE PROCESSING APPARATUS

(71) Applicant: SHIBAURA MECHATRONICS CORPORATION, Kanagawa (JP)

(72) Inventors: Kensuke Demura, Kanagawa (JP); Daisuke Matsushima, Kanagawa (JP); Masaya Kamiya, Kanagawa (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 583 days.

(21) Appl. No.: 17/469,876

(22) Filed: Sep. 9, 2021

(65) Prior Publication Data
US 2022/0080468 A1 Mar. 17, 2022

(30) Foreign Application Priority Data

Sep. 11, 2020 (JP) .................................. 2020-153171
Jul. 8, 2021 (JP) .................................. 2021-113228

(51) Int. Cl.
*B08B 3/10* (2006.01)
*B08B 3/04* (2006.01)
(Continued)

(52) U.S. Cl.
CPC .............. *B08B 3/10* (2013.01); *B08B 3/041* (2013.01); *B08B 7/0092* (2013.01); *B08B 13/00* (2013.01); *H01L 21/6875* (2013.01)

(58) Field of Classification Search
CPC ......... B08B 3/10; B08B 3/041; B08B 7/0092; B08B 13/00; B08B 3/02; B08B 3/024; B05B 13/041; B05B 13/0426; H01L 21/67051; H01L 21/6708; H01L 21/0209; H01L 21/67028; H01L 21/67034;
(Continued)

(56) References Cited

U.S. PATENT DOCUMENTS 6,276,378 B1 * 8/2001 Taniyama ......... H01L 21/67051
134/902
2006/0234503 A1 * 10/2006 Yamada ............... C25D 17/001
257/E21.228
(Continued)

FOREIGN PATENT DOCUMENTS

CN    108305842 A    7/2018
JP    H11-031673 A   2/1999
(Continued)

Primary Examiner — David G Cormier
Assistant Examiner — Thomas Bucci
(74) Attorney, Agent, or Firm — Venjuris, P.C.

(57) ABSTRACT

A substrate processing apparatus according to an embodiment of the present disclosure includes a stage having a substantially disc-shaped form and including a hole in a center thereof; a roller that contacts a side surface of the stage and rotates the stage; a first liquid nozzle that supplies a first liquid to a first surface of the substrate; a first driver that moves a position of the first liquid nozzle; a second liquid nozzle that supplies a second liquid from the hole of the stage to a second surface of the substrate; a second driver that moves a position of the second liquid nozzle; a cooling nozzle that supplies a cooling gas from the hole of the stage to the second surface; a third driver that moves a position of the cooling nozzle; and a controller that controls the first driver, the second driver, and the third driver.

20 Claims, 13 Drawing Sheets

(51) Int. Cl.
  *B08B 7/00*  (2006.01)
  *B08B 13/00* (2006.01)
  *H01L 21/687* (2006.01)

(58) Field of Classification Search
  CPC ......... H01L 21/68742; H01L 21/02016; H01L 21/02054; H01L 21/3065
  USPC ...................................................... 134/58 R
  See application file for complete search history.

(56) References Cited

U.S. PATENT DOCUMENTS

| | | | | |
|---|---|---|---|---|
| 2007/0082134 A1* | 4/2007 | Fukuda | ................... | G03F 7/168 427/337 |
| 2007/0235062 A1* | 10/2007 | Fujiwara | ........... | H01L 21/67051 134/4 |
| 2008/0060686 A1* | 3/2008 | Miya | ................. | H01L 21/02052 134/37 |
| 2008/0121251 A1* | 5/2008 | Miya | ................. | H01L 21/67051 134/4 |
| 2008/0121252 A1* | 5/2008 | Miya | .................... | B08B 7/0092 134/4 |
| 2008/0280054 A1* | 11/2008 | Ogata | ............... | H01L 21/67051 134/33 |
| 2009/0101181 A1* | 4/2009 | Morisawa | ......... | H01L 21/67173 134/115 R |
| 2009/0126760 A1* | 5/2009 | Banerjee | ........... | H01L 21/67207 134/1 |
| 2009/0202951 A1* | 8/2009 | Yamamoto | ............... | B05D 5/06 134/198 |
| 2010/0200163 A1* | 8/2010 | Puggi | ................ | H01L 21/67051 156/345.23 |
| 2010/0313915 A1* | 12/2010 | Fujiwara | ........... | H01L 21/67051 134/102.1 |
| 2010/0325913 A1* | 12/2010 | Wang | ........................ | F26B 5/12 34/69 |
| 2013/0167877 A1* | 7/2013 | Fujiwara | ........... | H01L 21/67051 134/105 |
| 2013/0220368 A1* | 8/2013 | Ishibashi | ............. | H01L 21/6715 134/6 |
| 2013/0258300 A1* | 10/2013 | Nishiyama | ................ | B08B 3/04 15/21.1 |
| 2014/0083468 A1* | 3/2014 | Miyazaki | .......... | H01L 21/67046 134/82 |
| 2015/0020850 A1* | 1/2015 | Kato | ........................ | B08B 3/10 134/4 |
| 2016/0240406 A1* | 8/2016 | Kajihara | ................ | F25B 9/02 |
| 2017/0001223 A1* | 1/2017 | Lee | ................... | H01L 21/02052 |
| 2017/0043379 A1* | 2/2017 | Sasaki | ................. | H01L 21/6708 |
| 2017/0056936 A1* | 3/2017 | Nishiyama | ........ | H01L 21/67028 |
| 2018/0182645 A1* | 6/2018 | Nakano | ............ | H01L 21/67051 |
| 2018/0195178 A1* | 7/2018 | Otsuji | ....................... | C23F 1/02 |

FOREIGN PATENT DOCUMENTS

| | | | |
|---|---|---|---|
| KR | 19990013348 A | * | 2/1999 |
| TW | 201833997 A | | 9/2018 |

* cited by examiner

SUBSTRATE PROCESSING APPARATUS

CROSS-REFERENCE TO RELATED APPLICATIONS

This application is based on and claims priority from Japanese Patent Application Nos. 2020-153171 and 2021-113228, filed on Sep. 11, 2020 and Jul. 8, 2021, respectively, with the Japan Patent Office, the disclosures of which are incorporated herein in their entireties by reference.

TECHNICAL FIELD

The present disclosure relates to a plasma processing apparatus.

BACKGROUND

Fine uneven portions (e.g., minute irregularities) are formed on the surface of a substrate such as an imprinting template, a photolithography mask substrate, and a semiconductor wafer.

Here, as for a method of removing contaminants such as particles that adhere to the surface of the substrate, an ultrasonic cleaning method or a two-fluid spray cleaning method is known. However, when ultrasonic waves are applied to the substrate or a fluid is sprayed onto the surface of the substrate, the fine uneven portions formed on the surface of the substrate may be damaged. Further, in recent years, the uneven portions have become finer, and thus, are more likely to be damaged.

Accordingly, as for an apparatus for removing contaminants that adhere to the surface of the substrate, a freeze-cleaning apparatus has been proposed (see, e.g., Japanese Patent Laid-Open Publication No. H11-031673).

The freeze-cleaning apparatus includes a disc-shaped member that adsorbs and holds a substrate, a pure water supply nozzle that supplies pure water to the surface of the substrate held by the disc-shaped member, and a cooling nozzle that supplies a cooling medium to the opposite surface of the disc-shaped member to the surface thereof on which the substrate is held. In this case, the freeze-cleaning is performed on the front surface of the substrate to which pure water is supplied, and the freeze-cleaning is not performed on the back surface of the substrate to which pure water is not supplied.

In recent years, there has been a demand to remove contaminants such as particles that adhere to the back surface of the substrate as well. In this case, by inverting the substrate after the front surface of the substrate is freeze-cleaned, and freeze-cleaning the back surface of the substrate, the contaminants such as particles that adhere to the back surface of the substrate may also be removed. However, in this case, the configuration of the apparatus becomes complicated, and the time for cleaning the substrate increases.

Thus, there has been a demand to develop a substrate processing apparatus capable of sequentially cleaning the front surface and the back surface of the substrate.

SUMMARY

An object of the present disclosure is to provide a substrate processing apparatus capable of sequentially cleaning the front surface and the back surface of a substrate.

A substrate processing apparatus according to an embodiment of the present disclosure includes a stage having a substantially disc-shaped form and including a hole in a center thereof; a roller configured to contact a side surface of the stage and rotate the stage; a plurality of holding pins provided on the stage and configured to hold a substrate; a first liquid nozzle configured to supply a first liquid to a first surface of the substrate opposite to a side that faces the stage; a first driver configured to move a position of the first liquid nozzle; a second liquid nozzle configured to supply a second liquid from the hole of the stage to a second surface of the substrate on the side that faces the stage; a second driver configured to move a second position of the second liquid nozzle; a cooling nozzle configured to supply a cooling gas from the hole of the stage to the second surface; a third driver configured to move a position of the cooling nozzle; and a controller configured to control the first driver, the second driver, and the third driver. When the cooling gas is supplied to the second surface, the controller controls the third driver to dispose the cooling nozzle below the second surface, and controls the second driver to move the second liquid nozzle to a retracted position of the second liquid nozzle. Alternatively, when the second liquid is supplied to the second surface, the controller controls the second driver to dispose the second liquid nozzle below the second surface, and controls the third driver to move the cooling nozzle to a retracted position of the cooling nozzle.

Embodiments of the present disclosure provide a substrate processing apparatus capable of sequentially cleaning the front surface and the back surface of a substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

Figure 1:
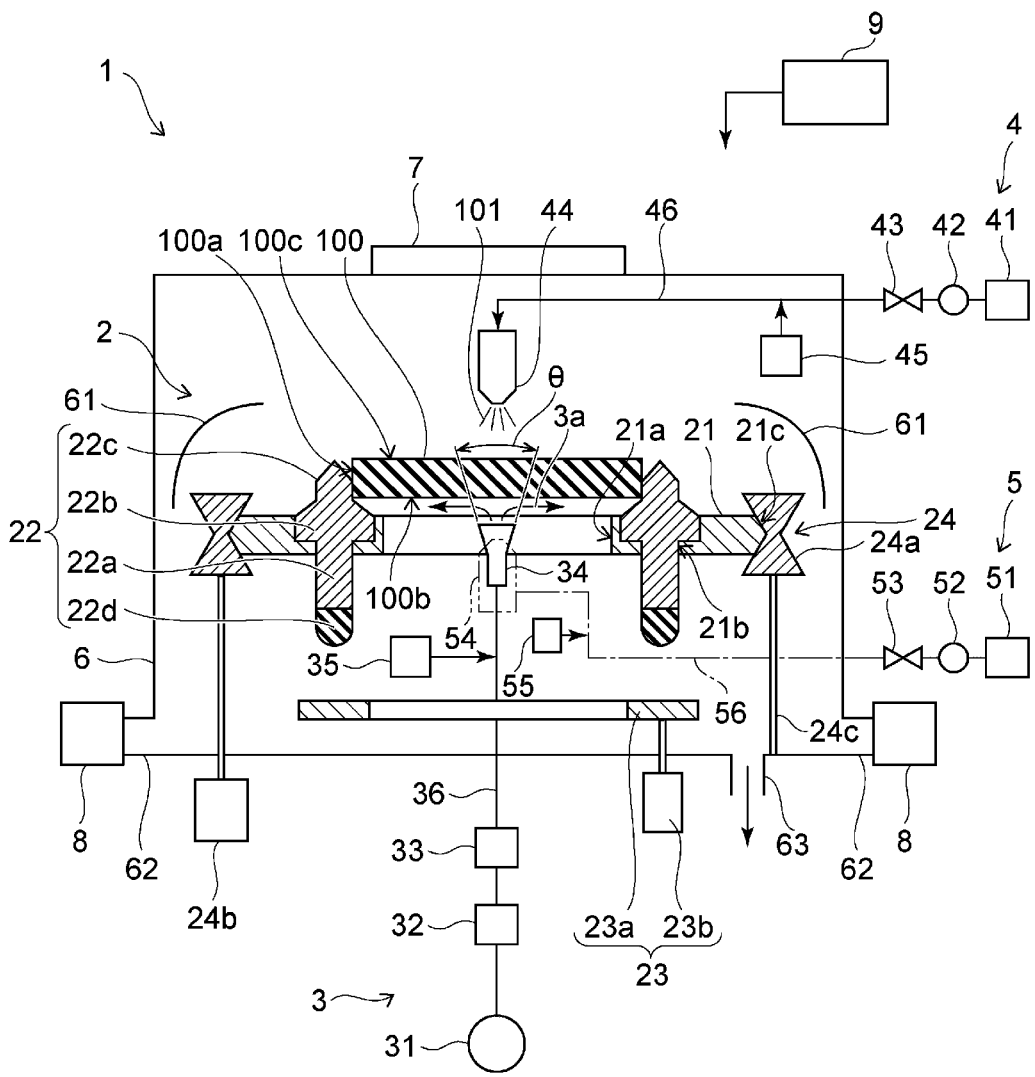
FIG. 1 is a schematic view illustrating a substrate processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments will be described with reference to the drawings. In the respective drawings, the same components will be denoted by the same reference numerals, and detailed descriptions thereof will be appropriately omitted.

A substrate 100 described herein below may be, for example, a semiconductor wafer, an imprinting template, a photolithography mask substrate, or a plate-like body used for a micro electro mechanical system (MEMS).

However, the application of the substrate 100 is not limited to the examples described above.

FIG. 1 is a schematic view illustrating a substrate processing apparatus 1 according to an embodiment of the present disclosure.

As illustrated in FIG. 1, the substrate processing apparatus 1 includes a placing unit 2, a cooling unit 3, a first liquid supply unit 4, a second liquid supply unit 5, a housing 6, a blowing unit 7, an exhaust unit 8, and a controller 9.

The placing unit 2 includes a stage 21, a holding pin 22, an elevating unit 23, and a rotating unit 24.

The stage 21 is rotatably provided inside the housing 6. The stage 21 has, for example, a substantially disc shape, and includes the tapered side surface 21c. In the central portion of the stage 21, a hole 21a is provided to penetrate the stage 21 in the thickness direction.

Further, a plurality of holes 21b is provided to penetrate the stage 21 in the thickness direction. For example, the plurality of holes 21b may be provided along the peripheral edge of the substrate 100. For example, when the planar shape of the substrate 100 is circular, the plurality of holes 21b may be provided at equal intervals on the circumference around the center of the substrate 100. For example, when the planar shape of the substrate 100 is quadrangular, the holes 21b may be provided in the vicinity of the corners of the substrate 100.

Each hole 21b may be a stepped hole of which the opening diameter close to the substrate 100 is larger than the opening diameter opposite to the substrate 100. The holding pin 22 is movably provided inside the hole 21b.

A plurality of holding pins 22 is provided, and may come into contact with the side surface 100a of the substrate 100 and the edge of the back surface 100b (corresponding to an example of a second surface) of the substrate 100. That is, the plurality of holding pins 22 are provided on the stage 21 to hold the substrate 100. When the substrate 100 is held by the plurality of holding pins 22, the front surface 100c of the substrate 100 (corresponding to an example of a first surface) faces the direction opposite to the stage 21.

Each holding pin 22 has a columnar shape, and may include a guide unit 22a, a support unit 22b, a holder unit 22c, and a buffer unit 22d. The guide unit 22a, the support unit 22b, and the holder unit 22c may be integrally formed. The guide unit 22a, the support unit 22b, and the holder unit 22c may be formed of, for example, a metal such as stainless steel.

The guide unit 22a has a cylindrical shape and may be provided inside the hole 21b. A slight gap is provided between the guide unit 22a and the inner wall of the hole 21b opposite to the substrate 100, such that the guide unit 22a (holding pin 22) is movable along the hole 21b.

The support unit 22b has a cylindrical shape and may be provided at one end of the guide unit 22a. The diameter dimension of the support unit 22b may be larger than the diameter dimension of the guide unit 22a. The end of the support unit 22b opposite to the guide unit 22a has a tapered surface. When the end of the support unit 22b has the tapered surface, the holding pin 22 may be easily brought into contact with the edge of the back surface 100b of the substrate 100 without contacting the back surface 100b of the substrate 100.

The holder unit 22c has a cylindrical shape and may be provided at the end of the support unit 22b opposite to the guide unit 22a. The diameter dimension of the holder unit 22c may be smaller than the diameter dimension of the support unit 22b. The tip of the holder unit 22c has a tapered surface. When the tip of the holder unit 22c has the tapered surface, the substrate 100 may be easily inserted into the region where the plurality of holding pins 22 are provided, from above.

The buffer unit 22d has a cylindrical shape, and is provided at the end of the guide unit 22a opposite to the support unit 22b. The tip of the buffer unit 22d may be, for example, hemispherical. The buffer unit 22d may be formed of an elastic body such as silicon rubber. The buffer unit 22d may be attached to, for example, the end of the guide unit 22a.

When the holding pin 22 is mounted inside the hole 21b, the end of the support 22b close to the guide unit 22a comes into contact with the bottom surface of the stepped portion of the hole 21b. Thus, the positions of the plurality of holding pins 22 with respect to the stage 21, and furthermore, the position of the substrate 100 with respect to the stage 21 become substantially constant. Further, since the plurality of holding pins 22 (the holders 22c) come into contact with the side surface 100a of the substrate 100, the substrate 100 may be suppressed from being out of the position due to the centrifugal force when the substrate 100 is rotated.

The elevating unit 23 may include a pusher 23a and a driver unit 23b.

The pusher 23a may be provided inside the housing 6. The pusher 23a may be provided at the position that faces the plurality of holding pins 22. The pusher 23a may be, for example, a plate-like body that has a planar ring shape. As described above, the arrangement of the plurality of holding pins 22 is changed according to the planar shape and the planar dimension of the substrate 100. Thus, the planar shape and the planar dimension of the pusher 23a may be changed according to the planar shape and the planar dimension of the substrate 100 (the arrangement of the plurality of holding pins 22). For example, when the planar shape of the substrate 100 is circular, the planar shape of the pusher 23a may be annular. For example, when the planar shape of the substrate 100 is quadrangular, the planar shape of the pusher 23a may be a quadrangular ring shape.

The driver unit 23b may be provided outside the housing 6. The driver unit 23b moves the position of the pusher 23a in the elevating direction. The driver unit 23b is not particularly limited and may be any driver that is able to move the pusher 23a up and down. The driver unit 23b may be provided with, for example, a device such as an air cylinder or a servomotor, or a guide mechanism.

Figure 5:
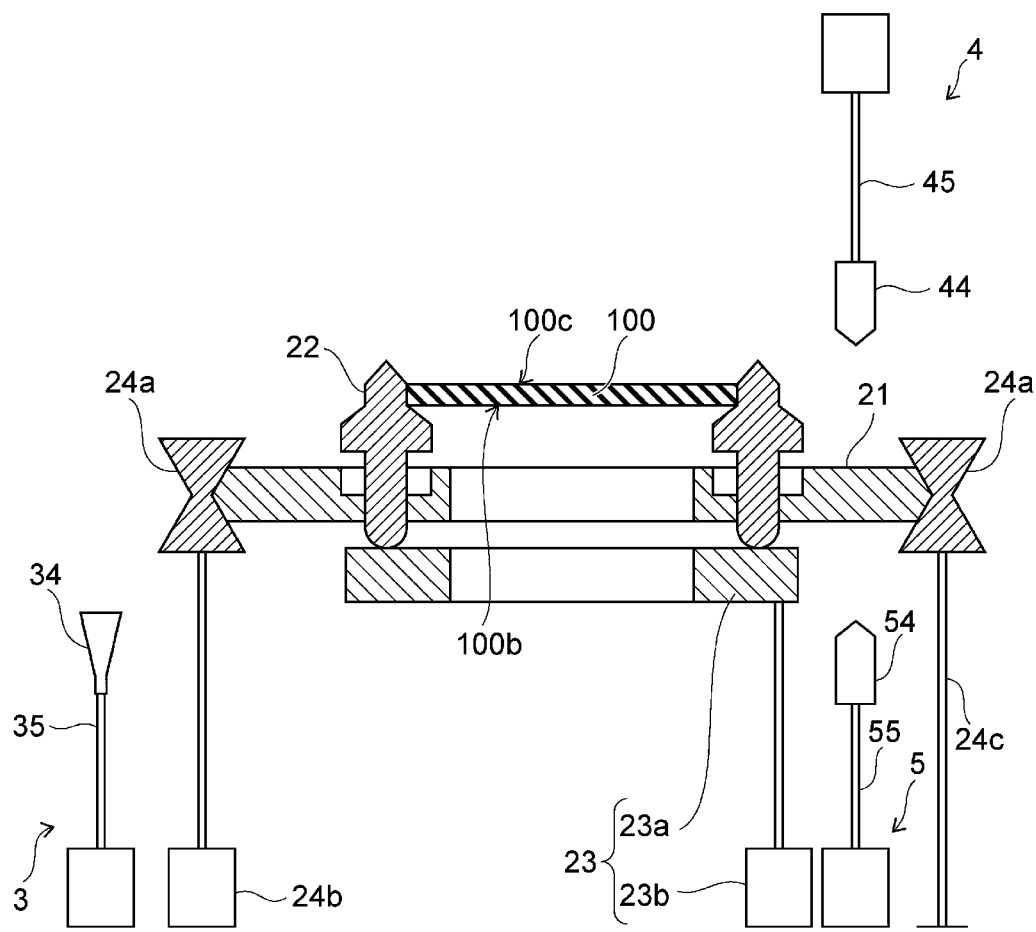
FIG. 5 is a schematic view illustrating an arrangement of nozzles when a carry-in step and a carry-out step are performed.

For example, when the substrate 100 is transferred between a transfer device (not illustrated) and the placing unit 2, the driver unit 23b moves up the pusher 23a as illustrated in FIG. 5 to be described later. When the pusher 23a moves up, the plurality of holding pins 22 are lifted by the pusher 23a, and the distance between the substrate 100 and the stage 21 increases. When the distance between the substrate 100 and the stage 21 increases, the substrate 100 may be easily transferred between the transfer device (not illustrated) and the placing unit 2.

For example, when the substrate 100 is rotated for a freeze-cleaning to be described later, the driver unit 23b moves down the pusher 23a. When the pusher 23a moves down, the plurality of holding pins 22 move down so that the substrate 100 is held at a predetermined position on the stage 21. At this time, as illustrated in FIG. 1, a predetermined gap is formed between the holding pin 22 and the pusher 23a. Thus, when the stage 21 (the substrate 100) is rotated, the holding pin 22 and the pusher 23a do not interfere with each other.

The rotating unit 24 rotates the stage 21 around the central axis of the stage 21. As described above, the substrate 100 is held by the plurality of holding pins 22 provided in the stage 21. Thus, the rotating unit 24 rotates the substrate 100 via the stage 21 and the plurality of holding pins 22. Accordingly, since the substrate 100 is indirectly rotated, it is possible to suppress an occurrence of damage such as rubbing on, for example, the side surface of the substrate 100. Further, it is possible to deal with various substrates 100 having different planar shapes and planar dimensions, only by changing the number or the arrangement of the plurality of holding pins 22. Further, the rotating unit 24 supports the stage 21.

The rotating unit 24 includes a roller 24a, a driver unit 24b, and a support unit 24c.

The roller 24a comes into contact with the side surface 21c of the stage 21 and rotates the stage 21. For example, a plurality of rollers 24a may be provided on the circumference around the central axis of the stage 21. For example, the plurality of rollers 24a may be provided at equal intervals. The roller 24a may have, for example, a shape recessed in the vicinity of the center of the side surface thereof. The shape of the side surface of the roller 24a may be made fit with the shape of the side surface 21c of the stage 21. Thus, the contact portion between the side surface of the roller 24a and the side surface 21c of the stage 21 is increased, so that the rotational force of the roller 24a may be efficiently transmitted to the stage 21.

The driver unit 24b may be provided outside the housing 6. The driver unit 24b may be connected to one of the plurality of rollers 24a. In this case, the roller 24a to which the driver unit 24b is connected may serve as a drive roller, and the other rollers 24a may serve as guide rollers. Further, the roller 24a to which the driver unit 24b is connected and at least a part of the other rollers 24a may be connected by a transmission member such as a timing belt. The driver unit 24b may include a rotating device such as a motor. The driver unit 24b may change the number of rotation times (rotation speed), in addition to the starting and stopping of the rotation. The driver unit 24b may be provided with, for example, a control motor such as a servo motor. The other rollers 24a are rotatably supported by the support unit 24c.

The support unit 24c is a member that rotatably supports the roller 24a. The support unit 24c is, for example, a cylinder with a flange attached to one end thereof. The one end of the support unit 24c to which the flange is attached is fixed to the housing 6. The other end of the support unit 24c is connected to the lower surface of the roller 24a such that the rotation axis of the roller 24a and the central axis of the support unit 24c coincide with each other. The material of the support unit 24c may be, for example, a metal such as SUS or aluminum. However, the material is not limited thereto. A resin or ceramic may be used as long as the resin or ceramic has the strength that does not break under the load of the stage 21.

In a case where the support unit 24c is rotated together with the roller 24a, the one end of the support unit 24c is rotatably connected to the flange. For example, the one end of the support unit 24c is connected to the flange via a ball bearing. In a case where the support unit 24c is not rotated together with the roller 24a, the other end of the support unit 24c is rotatably connected to the lower surface of the roller 24a. For example, the other end of the support unit 24c is connected to the lower surface of the roller 24a via a ball bearing.

Since the roller 24a is rotatably supported by the driver unit 24b and the support unit 24c, the roller 24a may rotatably support the stage 21. That is, the rotating unit 24 rotatably supports the stage 21 via the roller 24a.

Figure 2:
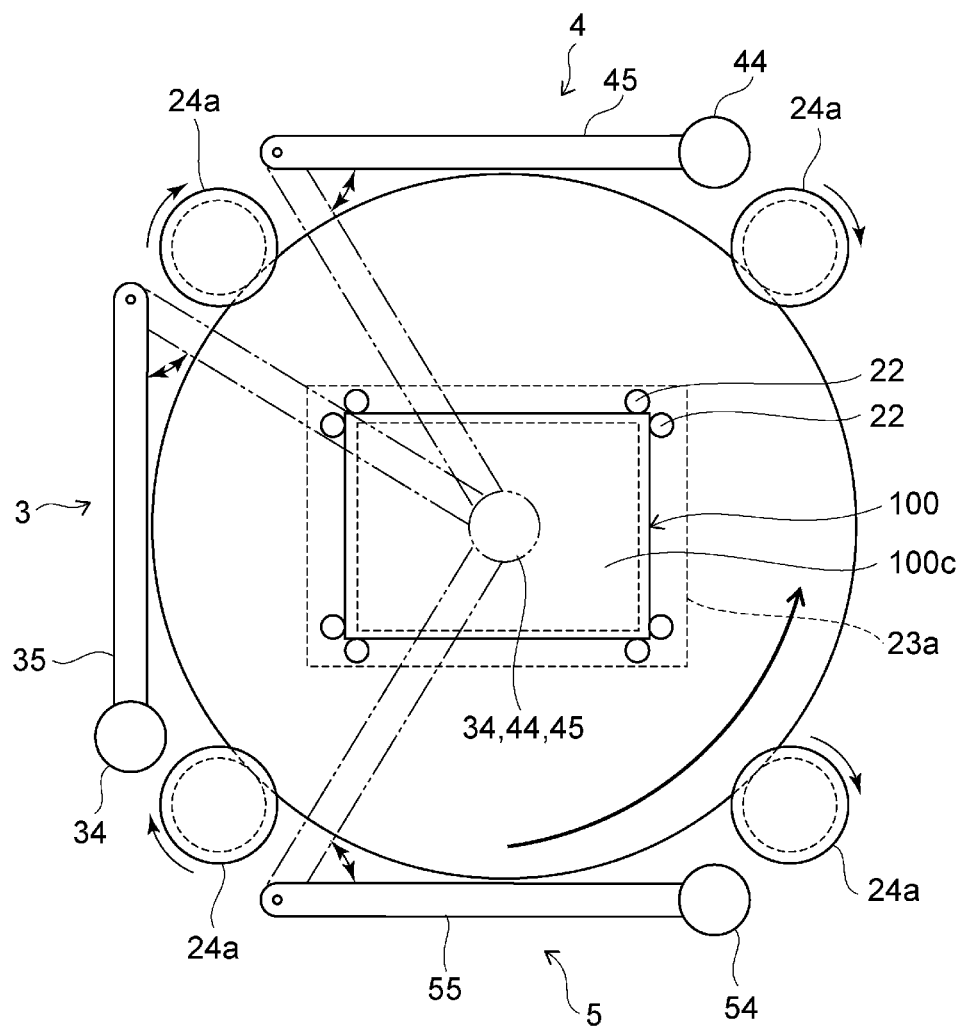
FIG. 2 is a schematic plan view illustrating a configuration and an arrangement of a cooling unit, a first liquid supply unit, and a second liquid supply unit.

FIG. 2 is a schematic plan view illustrating a configuration and an arrangement of the cooling unit 3, the first liquid supply unit 4, and the second liquid supply unit 5.

The cooling unit 3 directly supplies a cooling gas 3a to the back surface 100b of the substrate 100.

As illustrated in FIGS. 1 and 2, the cooling unit 3 includes a coolant unit 31, a filter 32, a flow rate controller unit 33, a cooling nozzle 34, a driver unit 35 (corresponding to an example of a third driver unit), and a pipe 36. The coolant unit 31, the filter 32, and the flow rate control unit 33 are provided outside the housing 6.

The coolant unit 31 stores a coolant and generates the cooling gas 3a. The coolant is obtained by liquefying the cooling gas 3a. The cooling gas 3a is not particularly limited and may be any gas that hardly reacts with the material of the substrate 100. The cooling gas 3a may be, for example, an inert gas such as nitrogen gas, helium gas, or argon gas. In this case, the time for cooling the substrate 100 may be reduced by using a gas having a high specific heat. For example, the time for cooling the substrate 100 may be reduced by using helium gas. In addition, the processing cost of the substrate 100 may be reduced by using nitrogen gas.

The coolant unit 31 includes a tank that stores the coolant, and a vaporizer that vaporizes the coolant stored in the tank. A cooling device is provided in the tank to maintain the temperature of the coolant. The vaporizer increases the temperature of the coolant to generate the cooling gas 3a from the coolant. The temperature of the cooling gas 3a may be a temperature at which a liquid 101 (corresponding to an example of a first liquid) may be cooled to a temperature equal to or lower than the freezing point to be brought into a supercooled state. For example, the temperature of the cooling gas 3a may be a temperature equal to or lower than the freezing point of the liquid 101. For example, the temperature of the cooling gas 3a may be −170° C.

The filter 32 is connected to the coolant unit 31 via a pipe. The filter 32 suppresses the outflow of contaminants such as particles contained in the coolant toward the substrate 100.

The flow rate controller unit 33 is connected to the filter 32 via a pipe. The flow rate controller unit 33 controls the flow rate of the cooling gas 3a. The temperature of the cooling gas 3a generated from the coolant in the coolant unit 31 is substantially set to a predetermined temperature. Thus, by controlling the flow rate of the cooling gas 3a, the flow rate controller unit 33 may control the temperature of the substrate 100, and furthermore, the temperature of the liquid 101 on the substrate 100.

The flow rate controller unit 33 may be, for example, a mass flow controller (MFC). Further, the flow rate controller 33 may indirectly control the flow rate of the cooling gas 3a by controlling the supply pressure of the cooling gas 3a. In this case, the flow rate controller unit 33 may be, for example, an auto pressure controller (APC).

The cooling nozzle 34 supplies the cooling gas 3a from the hole 21a of the stage 21 to the back surface 100b of the substrate 100. One end of the cooling nozzle 34 is connected to the flow rate controller unit 33 via the pipe 36. The cooling nozzle 34 supplies the cooling gas 3a of which the flow rate is controlled by the flow rate controller unit 33, directly to the back surface 100b of the substrate 100.

The cooling nozzle 34 has a tubular shape, and has a tapered portion of which the inner diameter gradually increases toward the substrate 100. The cooling nozzle 34 may have, for example, a funnel shape. In this case, when the angle θ of the tapered portion of the cooling nozzle 34 is excessively large, the flow of the cooling gas 3a separates from the inner wall of the tapered portion, and thus, a turbulent flow occurs. When the turbulent flow occurs, the air between the substrate 100 and the stage 21 may be entrained into the flow, so that the temperature of the cooling gas 3a may rise, or an in-plane distribution may occur in the temperature of the substrate 100. Meanwhile, when the angle θ of the tapered portion of the cooling nozzle 34 is excessively small, the back surface 100b of the substrate 100 is locally cooled, and thus, an in-plane distribution may easily occur in the temperature of the substrate 100. According to the findings obtained by the present inventors, the angle θ of the tapered portion of the cooling nozzle 34 may be larger than 0° and 8° or less.

The driver unit 35 moves the position of the cooling nozzle 34 with respect to the substrate 100. As illustrated in FIG. 2, the driver unit 35 may be, for example, an articulated robot. However, the driver unit 35 is not limited to the articulated robot, and may be any unit capable of moving the cooling nozzle 34 between the position where the cooling gas 3a is supplied below the substrate 100 and a retraction position outside the substrate 100.

The pipe 36 is a pipe made of a material having a high thermal conductivity. The pipe 36 is made of, for example, a metal such as SUS or copper. Further, the pipe 36 has a shape in which a part of the pipe is bellows. The pipe 36 is connected to the driver unit 35. Since a part of the pipe 36 has the bellows shape, the pipe 36 may follow the operation of the driver unit 35. The pipe 36 may be covered with a heat insulating material.

The first liquid supply unit 4 supplies the liquid 101 to the front surface 100c of the substrate 100 (the surface opposite to the stage 21). The liquid 101 may be, for example, water (e.g., pure water or ultrapure water) or a liquid that contains water as a main component. The liquid that contains water as a main component may be, for example, a mixed liquid of water and alcohol, a mixed liquid of water and an acidic solution, or a mixed liquid of water and an alkaline solution. In this case, when the amount of a component other than water is excessively large, it may become difficult to utilize the physical force generated from a volume increase to be described later. Thus, the concentration of a component other than water may be 5 wt % or more and 30 wt % or less. Further, a gas may be dissolved in the liquid 101. The gas may be, for example, carbon dioxide gas, ozone gas, or hydrogen gas. The temperature of the liquid 101 may be, for example, about room temperature (20° C.).

As illustrated in FIG. 1, the first liquid supply unit 4 includes a liquid storage unit 41, a supply unit 42, a flow rate controller unit 43, a liquid nozzle 44 (corresponding to an example of a first liquid nozzle), a driver unit 45, and a pipe 46. The liquid storage unit 41, the supply unit 42, and the flow rate controller unit 43 may be provided outside the housing 6.

The liquid storage unit 41 stores the liquid 101.

The supply unit 42 is connected to the liquid storage unit 41 via the pipe 46. The supply unit 42 supplies the liquid 101 stored in the liquid storage unit 41 toward the liquid nozzle 44.

The flow rate controller unit 43 is connected to the supply unit 42 via a pipe. The flow rate controller unit 43 controls the flow rate of the liquid 101 supplied by the supply unit 42. The flow rate controller 43 may be, for example, a flow rate control valve. Further, the flow rate controller unit 43 may also start and stop the supply of the liquid 101.

The liquid nozzle 44 is provided inside the housing 6. The liquid nozzle 44 supplies the liquid 101 to the front surface 100c of the substrate 100. The liquid nozzle 44 has a tubular shape. One end of the liquid nozzle 44 is connected to the flow rate controller unit 43 via a pipe. When the liquid 101 is supplied to the front surface 100c of the substrate 100, the other end of the liquid nozzle 44 faces the front surface 100c of the substrate 100 placed on the stage 21. In this case, the other end of the liquid nozzle 44 (the ejection hole of the liquid 101) may face substantially the center of the front surface 100c of the substrate 100.

The driver unit 45 moves the position of the cooling nozzle 44 with respect to the substrate 100. As illustrated in FIG. 2, the driver unit 45 may be, for example, an articulated robot. However, the driver unit 45 is not limited to the articulated robot, and may be any unit capable of moving the cooling nozzle 44 between the position where the liquid 101 is supplied above the substrate 100 and a retraction position outside the substrate 100.

The pipe 46 is a flexible pipe. The pipe 46 is, for example, a tube made of resin. Examples of the resin include polyurethane (PU), nylon, polyvinyl chloride (PVC), polypropylene (PP), polytetrafluoroethylene (PTFE), polyvinylidene fluoride (PVDF), chlorotrifluoroethylene (CTFE), and polyolefin. The pipe 46 is connected to the driver unit 45 so as to follow the operation of the driver 45.

The second liquid supply unit 5 supplies a liquid 102 (corresponding to an example of a second liquid) to the back surface 100b of the substrate 100. The liquid 102 is used in a back surface cleaning step to be described later. Thus, the liquid 102 is not particularly limited, and may be any liquid that hardly reacts with the material of the substrate 100 and hardly remains on the substrate 100 in a drying step to be described later. The liquid 102 may be, for example, water (e.g., pure water or ultrapure water) or a mixed liquid of water and alcohol. The temperature of the liquid 102 may be, for example, about room temperature (20° C.).

As illustrated in FIG. 1, the second liquid supply unit 5 includes a liquid storage unit 51, a supply unit 52, a flow rate controller unit 53, a liquid nozzle 54 (corresponding to an example of a second liquid nozzle), a driver unit 55 (corresponding to an example of a second driver), and a pipe 56.

The liquid storage unit 51 may be the same as the liquid storage unit 41 described above. The supply unit 52 may be the same as the supply unit 42 described above. The flow rate controller unit 53 may be the same as the flow rate controller unit 43 described above. The liquid nozzle 54 may be the same as the liquid nozzle 44 described above. However, the liquid nozzle 54 supplies the liquid 102 from the hole 21a of the stage 21 to the back surface 100b of the substrate 100.

The driver unit 55 moves the position of the liquid nozzle 54 with respect to the substrate 100. As illustrated in FIG. 2, the driver unit 55 may be, for example, an articulated robot. However, the driver 55 is not limited to the articulated robot, and may be any unit capable of moving the cooling nozzle 54 between the position where the liquid 102 is supplied below the substrate 100 and a retraction position outside the substrate 100.

When the liquid 102 is the same as the liquid 101, for example, the liquid storage unit 51, the supply 52, and the flow rate controller 53 may be omitted, and the flow rate controller 43 and the liquid nozzle 54 may be connected via a switching valve.

Here, as will be described later, when the surface 100c of the substrate 100 is freeze-cleaned, a preliminary step, a liquid film forming step, a cooling step, and a thawing step are performed. Further, after the freeze-cleaning, a cleaning step is performed on the back surface 100b of the substrate 100. Further, after the back surface 100b of the substrate 100 is cleaned, a drying step is performed. After the back surface 100b of the substrate 100 is cleaned, the front surface 100c of the substrate 100 may be freeze-cleaned. Further, a carry-in step of delivering an uncleaned substrate 100 to the placing unit 2 and a carry-out step of receiving the cleaned substrate 100 from the placing unit 2 are performed.

In this case, the cooling nozzle 34, the liquid nozzle 44, and the liquid nozzle 54 need to be arranged at appropriate positions according to the contents of the steps described above. Thus, as described above, the cooling nozzle 34 is movable by the driver 35, the liquid nozzle 44 is movable by the driver unit 45, and the liquid nozzle 54 is movable by the driver unit 55. The contents of each step and the arrangement of the nozzles in each step will be described in detail later.

The housing 6 has a box shape. A cover 61 may be provided inside the housing 6. The cover 61 receives the liquids 101 and 102 discharged to the outside of the substrate 100 due to the rotation of the substrate 100. When the cover 61 is provided, the liquids 101 and 102 may be effectively collected. A drain 63 may be provided in the bottom surface of the housing 6, to discharge the collected liquids 101 and 102 to the outside of the housing 6.

The blowing unit 7 is provided on the ceiling surface of the housing 6. The blowing unit 7 may be provided on the side surface of the housing 6 close to the ceiling thereof. The blowing unit 7 may be provided with a blower such as a fan, and a filter. When the blowing unit 7 is provided, the pressure inside the housing 6 becomes higher than the pressure outside the housing 6. As a result, the used cooling gas 3a is easily guided to a discharge port 62. Further, contaminants such as particles may be suppressed from entering the housing 6.

The exhaust unit 8 is connected to the discharge port 62 provided close to the bottom surface of the housing 6. The exhaust unit 8 discharges the used cooling gas 3a and the air supplied from the blowing unit 7, from the discharge port 62 to the outside of the housing 6. The exhaust unit 8 may be, for example, a blower.

The controller 9 controls the operation of each component provided in the substrate processing apparatus 1. The controller 9 may include, for example, an arithmetic device such as a central processing unit (CPU) and a storage device such as a semiconductor memory. The controller 9 may be, for example, a computer. The storage device may store a control program for controlling the operation of each component provided in the substrate processing apparatus 1. The arithmetic device controls the operation of each component provided in the substrate processing apparatus 1 by using, for example, the control program stored in the storage device and data input by an operator.

For example, the cooling rate of the liquid 101 correlates with the thickness of a liquid film. For example, as the liquid film is thinner, the cooling rate of the liquid 101 is faster. Conversely, as the liquid film is thicker, the cooling rate of the liquid 101 is slower. Accordingly, based on the thickness of the liquid 101 (thickness of the liquid film), the controller 9 may control the cooling unit 3 to control the flow rate of the cooling gas 3a, and furthermore, control the cooling rate of the liquid 101. In this case, the correlation between the cooling rate of the liquid 101 and the thickness of the liquid film may be obtained by conducting experiments or simulations in advance.

Next, referring to FIGS. 3 to 8, the operation of the substrate processing apparatus 1 will be described.

Figure 3:
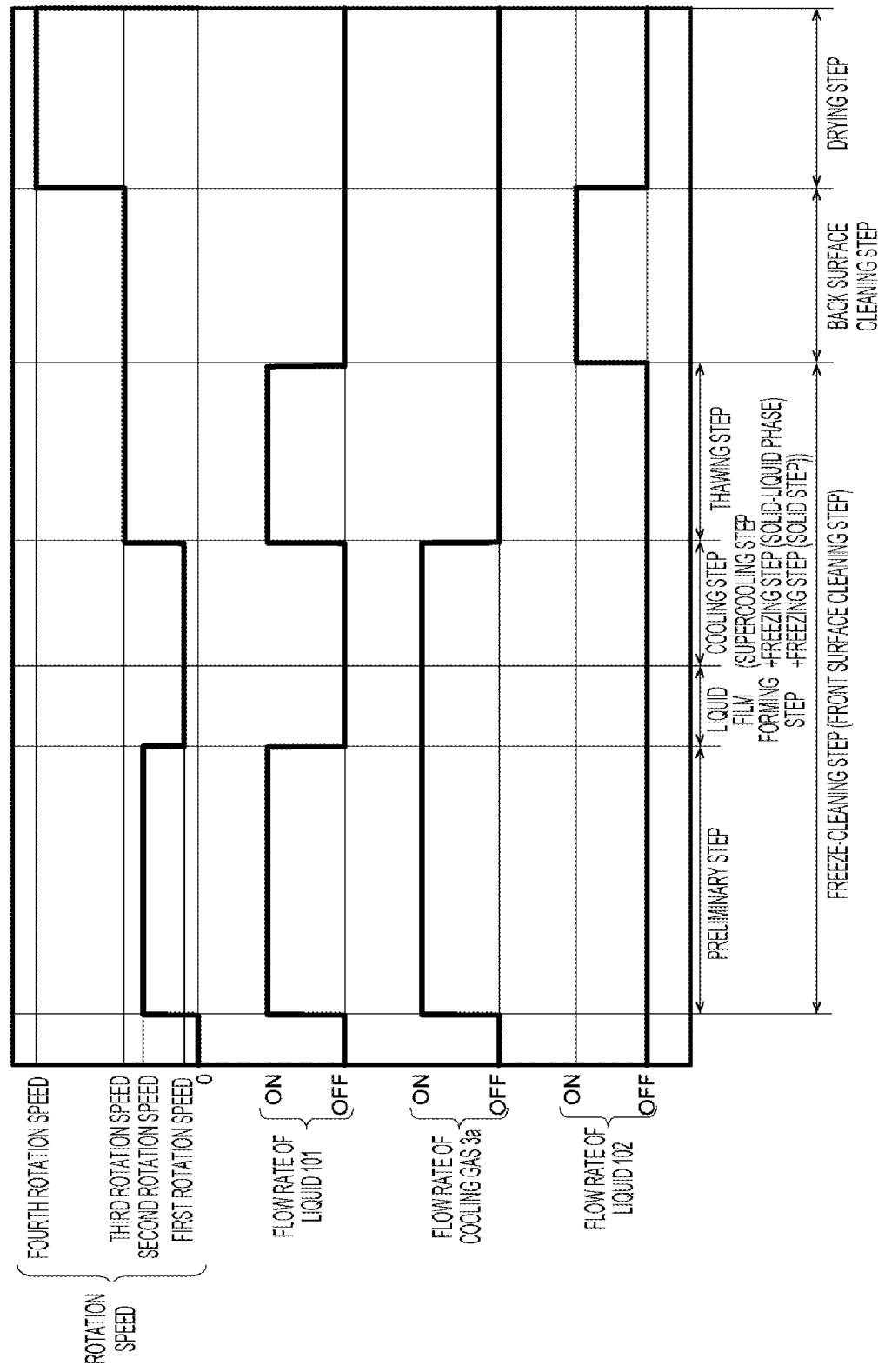
FIG. 3 is a timing chart illustrating an operation of the substrate processing apparatus.

FIG. 3 is a timing chart illustrating the operation of the substrate processing apparatus 1.

Figure 4:
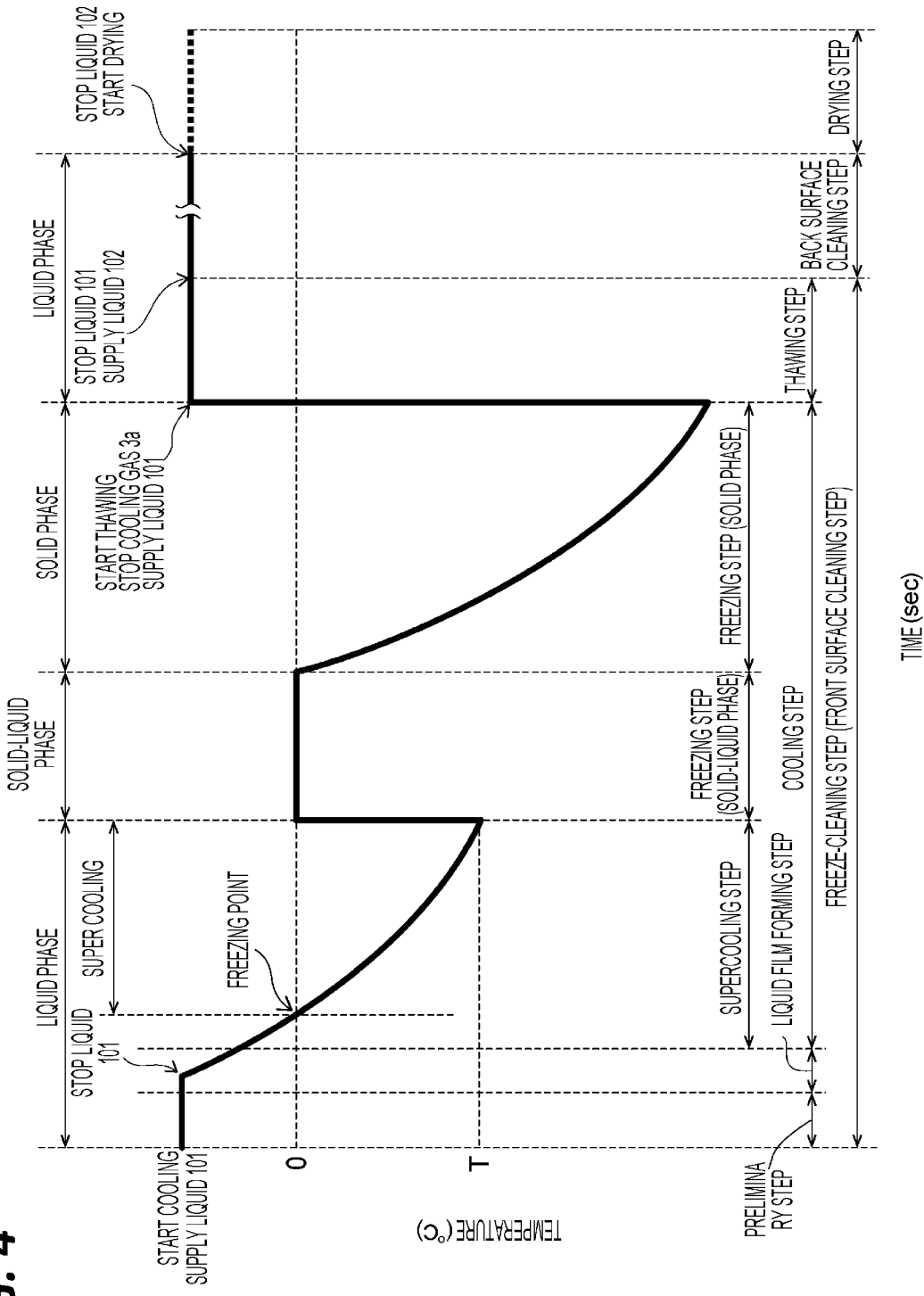
FIG. 4 is a graph illustrating a temperature variation in a freeze-cleaning step (front surface cleaning step), a back surface cleaning step, and a drying step.

FIG. 4 is a graph illustrating a temperature variation in the freeze-cleaning step (the front surface cleaning step), the back surface cleaning step, and the drying step.

FIGS. 3 and 4 represent a case where the substrate 100 is a 6,025 quartz (Qz) substrate (152 mm×152 mm×6.35 mm), and the liquids 101 and 102 are pure water.

FIG. 5 is a schematic view illustrating an arrangement of the nozzles when the carry-in step and the carry-out step are performed.

Figure 6:
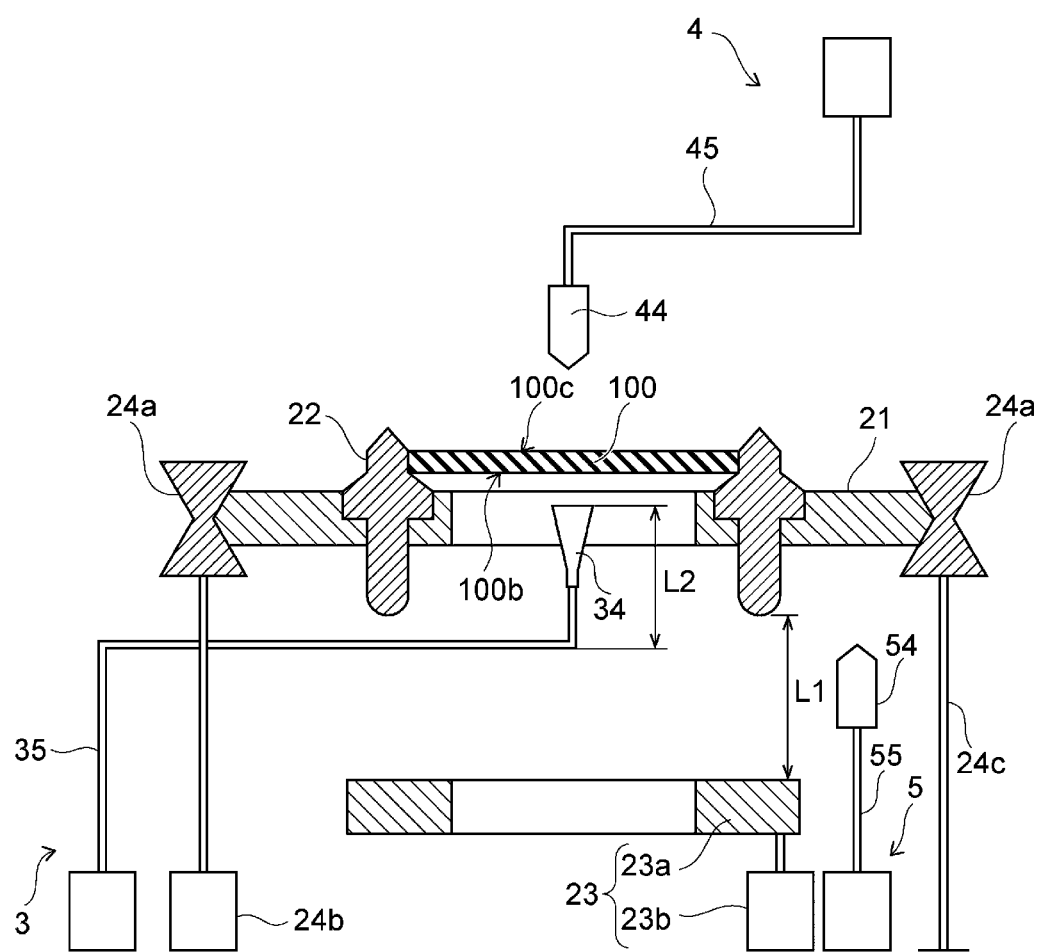
FIG. 6 is a schematic view illustrating an arrangement of the nozzles when the freeze-cleaning step is performed.

FIG. 6 is a schematic view illustrating an arrangement of the nozzles when the freeze-cleaning step is performed.

Figure 7:
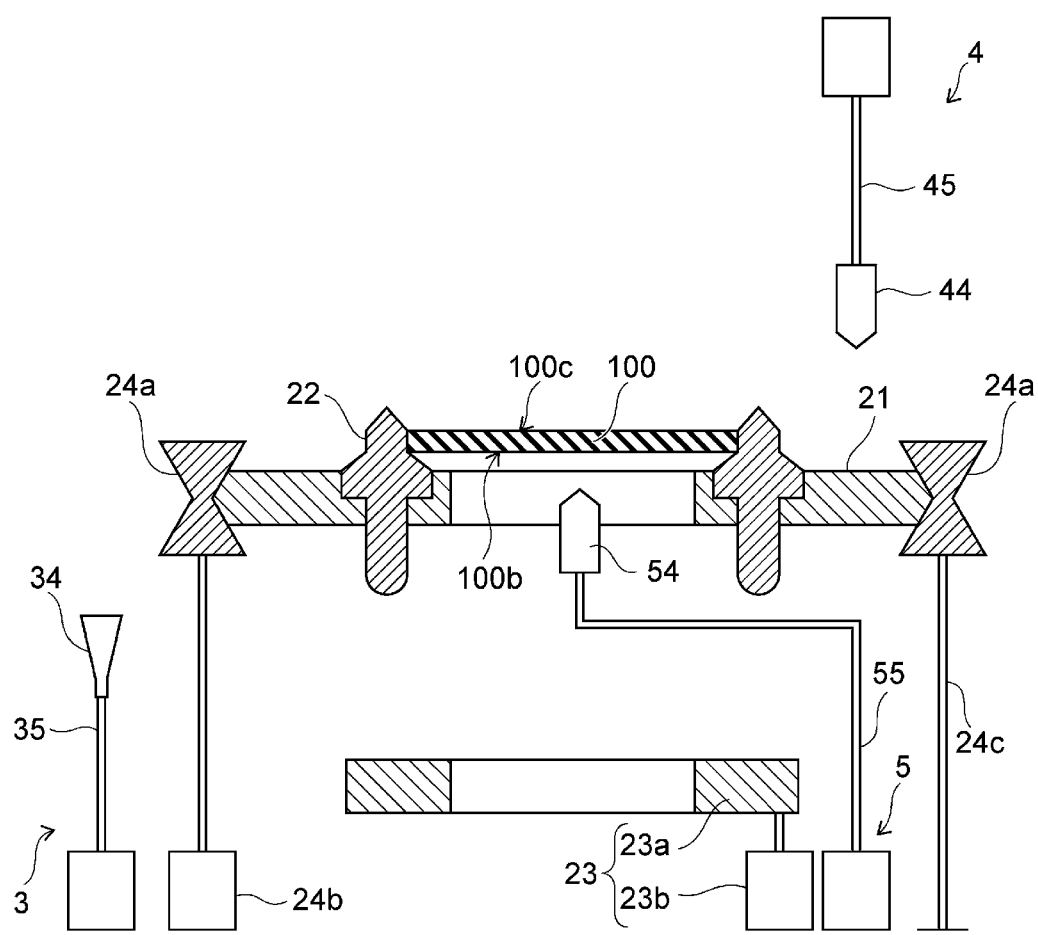
FIG. 7 is a schematic view illustrating an arrangement of the nozzles when the back surface cleaning step is performed.

FIG. 7 is a schematic view illustrating an arrangement of the nozzles when the back surface cleaning step is performed.

Figure 8:
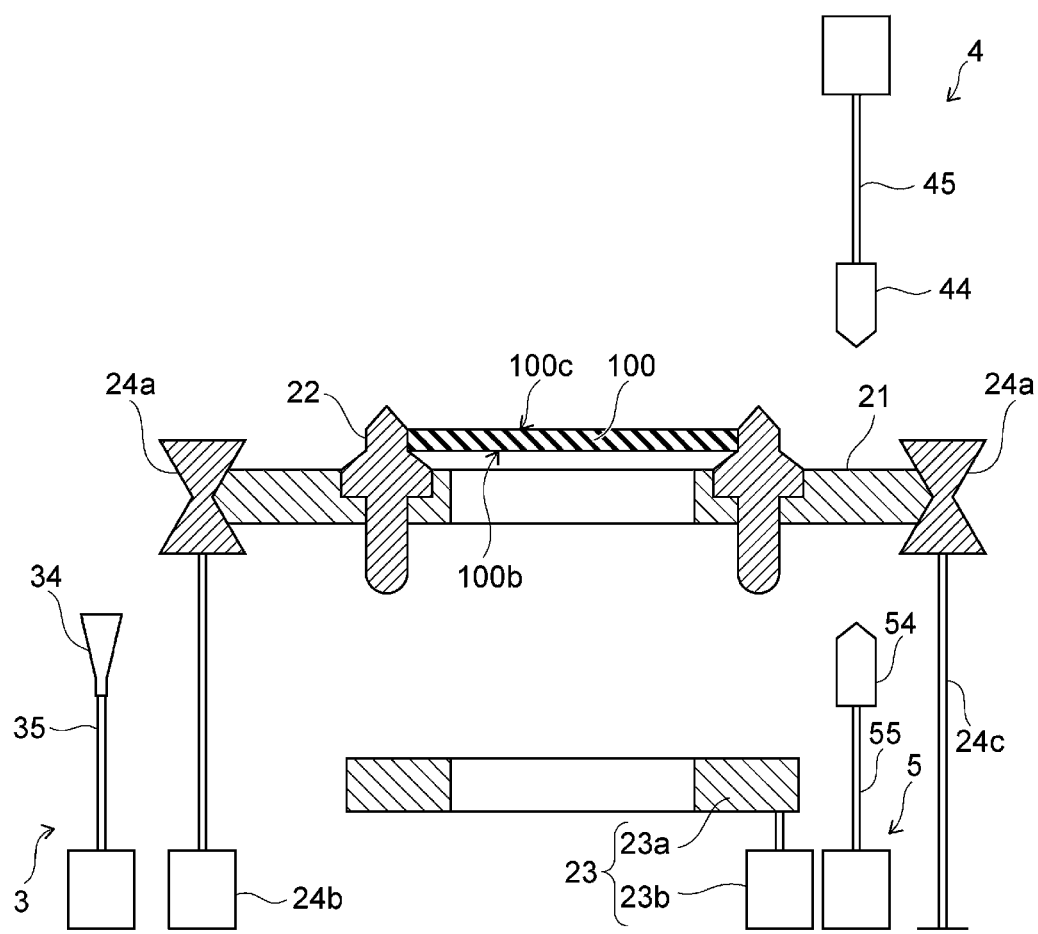
FIG. 8 is a schematic view illustrating an arrangement of the nozzles when the drying step is performed.

FIG. 8 is a schematic view illustrating an arrangement of the nozzles when the drying step is performed.

First, the substrate 100 is carried into the housing 6 through a carry-in/out port (not illustrated) of the housing 6. In the carry-in step, as illustrated in FIG. 5, the controller 9 controls the driver unit 23b to move up the pusher 23a. When the pusher 23a moves up, the plurality of holding pins 22 are lifted, so that the distance between the position where the substrate 100 is placed on the plurality of holding pins 22 and the stage 21 increases. Thus, the substrate 100 may be easily transferred between a transfer device (not illustrated) and the placing unit 2.

Subsequently, the controller 9 controls the driver unit 23b to move down the pusher 23a. When the pusher 23a moves down, the plurality of holding pins 22 move down, so that the substrate 100 is held at a predetermined position on the stage 21.

Next, as illustrated in FIG. 6, the controller 9 controls the driver unit 45 to dispose the liquid nozzle 44 above substantially the center of the front surface 100c of the substrate 100. Further, the controller 9 controls the driver 35 to dispose the liquid nozzle 34 below substantially the center of the back surface 100b of the substrate 100. As illustrated in FIG. 6, a dimension L2 of the portion where the cooling nozzle 34 is disposed is smaller than a dimension L1 of the gap between the holding pins 22 and the elevating unit 23. Thus, the cooling nozzle 34 may pass through the gap between the holding pins 22 and the elevating unit 23.

Subsequently, as illustrated in FIG. 3, a freeze-cleaning step that includes a preliminary step, a liquid film forming step, a cooling step, and a thawing step is performed.

First, the preliminary step is performed as illustrated in FIGS. 3 and 4. In the preliminary step, the controller 9 controls the supply unit 42 and the flow rate controller unit 43 to supply the liquid 101 to the front surface 100c of the substrate 100 at a predetermined flow rate. Further, the controller 9 controls the flow rate controller unit 33 to supply the cooling gas 3a to the back surface 100a of the substrate 100 at a predetermined flow rate. Further, the controller 9 controls the driver unit 24b to rotate the substrate 100 at a predetermined rotation speed.

At this time, the controller 9 may control the driver unit 45 to swing the liquid nozzle 44 that is ejecting the liquid 101, along the front surface 100c of the substrate 100. In this manner, the liquid 101 may be supplied to a wider region of the front surface 100c of the substrate 100, so that a liquid film having a uniform thickness may easily be formed.

Further, the controller 9 may control the driver unit 35 to swing the liquid nozzle 34 that is ejecting the cooling gas 3a, along the back surface 100b of the substrate 100. In this manner, the cooling gas 3a may be supplied to a wider region of the back surface 100b of the substrate 100, so that the substrate 100 may be cooled more uniformly, and furthermore, the liquid 101 may be cooled uniformly in a wider region of the front surface 100c of the substrate 100.

Here, when the atmosphere inside the housing 6 is cooled due to the supply of the cooling gas 3a, frost containing dust in the atmosphere may adhere to the substrate 100, which may cause a contamination. In the preliminary step, since the liquid 101 is being continuously supplied to the surface 100c of the substrate 100, the adhesion of frost to the front surface 100c of the substrate 100 may be suppressed, while uniformly cooling the substrate 100.

For example, in the case illustrated in FIG. 3, the second rotation speed may be set to about 20 rpm to about 500 rpm, the flow rate of the liquid 101 may be set to about 0.1 L/min to about 1.0 L/min, the flow rate of the cooling gas 3a may be set to about 40 NL/min to about 200 NL/min, and the process time of the preliminary step may be set to about 1,800 seconds. The process time of the preliminary step may be any time during which the in-plane temperature of the substrate 100 becomes substantially uniform, and is appropriately determined by conducting an experiment or a simulation.

The temperature of the liquid film in the preliminary step becomes substantially the same as the temperature of the supplied liquid 101, since the liquid 101 is in a trickle flow state. For example, when the temperature of the supplied liquid 101 is about room temperature (20° C.), the temperature of the liquid film becomes about room temperature (20° C.).

Next, the liquid film forming step is performed as illustrated in FIGS. 3 and 4. In the liquid film forming step, the rotation speed of the substrate 100 is set to a rotation speed at which the liquid film is formed with a predetermined thickness that ensures a relatively high removal rate (a first rotation speed). For example, the first rotation speed is 0 rpm to 100 rpm. That is, the controller 9 rotates the substrate 100 at a rotation speed lower than the rotation speed during the preliminary step. Then, as illustrated in FIG. 4, the supply of the liquid 101 supplied in the preliminary step is stopped. The first rotation speed may be any rotation speed that may suppress the thickness of the liquid film from becoming uneven due to the centrifugal force. During the liquid film forming step, the flow rate of the cooling gas 3a is maintained at the same supply amount as that in the preliminary step. As a result, the in-plane temperature of the substrate 100 may be maintained in the substantially uniform state.

Further, the rotation speed in the preliminary step may be set to the first rotation speed. In this case, the rotation speed in the liquid film forming step may be maintained to be the same as the rotation speed in the preliminary step. Further, the second rotation speed may be a rotation speed equal to or less than the first rotation speed.

Further, when the preliminary step switches to the liquid film forming step, the supply of the liquid 101 may be stopped, and then, the liquid 101 supplied in the preliminary step may be discharged by rotating the substrate 100 at a high speed. In this case, once the liquid 101 is discharged, a predetermined amount of the liquid 101 may be supplied to the substrate 100, after setting the rotation speed of the substrate 100 to a rotation speed (50 rpm) or less that substantially maintains the liquid film with the uniform thickness, or stopping the rotation of the substrate 100. In this way, the liquid film having the predetermined thickness may be easily formed.

For example, the thickness of the liquid film when the cooling step is performed may be about 30 μm to about 1,300 μm. In this case, the controller 9 controls the supply amount of the liquid 101 and the rotation speed of the substrate 100 to set the thickness of the liquid film on the surface 100c of the substrate 100 to about 30 μm to about 1,300 μm.

Next, the cooling step is performed as illustrated in FIGS. 3 and 4. In the cooling step of the present embodiment, the time period until the start of the freezing of the liquid 101 brought into the supercooled state will be referred to as a "supercooling step," the time period from the start of the freezing of the liquid 101 in the supercooled state to the completion of the freezing will be referred to as a "freezing step (solid-liquid phase)," and the time period until the frozen liquid 101 is further cooled to cause cracks will be referred to as a "freezing step (solid phase)." In the supercooling step, only the liquid 101 exists on the front surface 100c of the substrate 100. In the freezing step (solid-liquid phase), the liquid 101 and the frozen liquid 101 exist on the front surface 100c of the substrate 100. In the freezing step (solid phase), only the frozen liquid 101 exists on the front surface 100c of the substrate 100.

Here, the solid-liquid phase refers to a state where the liquid 101 and the frozen liquid 101 coexist.

First, in the supercooling step, the temperature of the liquid film on the substrate 100 is further lowered as compared to the temperature of the liquid film in the liquid film forming step, by the cooling gas 3a that is being continuously supplied to the back surface 100b of the substrate 100, so that the liquid 101 enters the supercooled state.

Here, when the cooling rate of the liquid 101 becomes excessively fast, the liquid 101 is immediately frozen without entering the supercooled state. Thus, the controller 9 controls at least one of the rotation speed of the substrate 100, the flow rate of the cooling gas 3a, and the supply amount of the liquid 101, to bring the liquid 101 on the front surface 100c of the substrate 100 into the supercooled state.

The control conditions for bringing the liquid 101 into the supercooled state are affected by, for example, the size of the substrate 100, the viscosity of the liquid 101, and the specific heat of the cooling gas 3a. Thus, the control conditions for bringing the liquid 101 into the supercooled state may be appropriately determined by conducting an experiment or a simulation.

In the supercooled state, the freezing of the liquid 101 starts by, for example, the temperature of the liquid film, the existence of contaminants such as particles, and the vibration. For example, a case where contaminants such as particles exist, the freezing of the liquid 101 starts when a temperature T of the liquid 101 reaches −35° C. or higher and −20° C. or lower.

When the freezing of the liquid 101 in the supercooled state starts, the supercooling step switches to the freezing step (solid-liquid phase). In the freezing step (solid-liquid phase), the liquid 101 and the frozen liquid 101 exist on the front surface 100c of the substrate 100. As described above, it is considered that since the contaminants may trigger the start of the freezing of the liquid 101 in the supercooled state, the contaminants are incorporated into the solid. Further, it is considered that the contaminants adhering to the front surface 100c of the substrate 100 are separated by the pressure wave generated from the volume change or the physical force generated from the volume increase, when the liquid 101 is changed to a solid. Thus, it is considered that the cleaning is performed in the manner that the contaminants are incorporated into the solid, or the contaminants adhering to the front surface 100c of the substrate 100 are separated by the pressure wave or the physical force generated when a part of the liquid 101 is frozen.

When the liquid film on the front surface 100c of the substrate 100 is completely frozen, the freezing step (solid-liquid phase) switches to the freezing step (solid phase). In the freezing step (solid phase), the temperature of the frozen film on the front surface 100c of the substrate 100 is further lowered. Here, the liquid 101 mainly contains water. Thus, when the liquid film on the front surface 100c of the substrate 100 is completely frozen so that a frozen film is formed and the temperature of the frozen film is further lowered, the volume of the frozen film is reduced, and the stress is generated in the frozen film.

In this case, for example, when the temperature of the frozen film becomes −50° C. or lower, cracks are generated in the frozen film. When cracks are generated in the frozen film, the contaminants that adhere to the front surface 100c of the substrate 100 are more easily separated from the front surface 100c of the substrate 100.

Next, after the cracks are generated in the frozen film, the thawing step is performed as illustrated in FIGS. 3 and 4. The occurrence of cracking may be detected by, for example, a sensor (not illustrated). FIGS. 3 and 4 illustrate a case where the liquid 101 is supplied by the first liquid supply unit 4 to thaw the frozen film. Thus, the controller 9 controls the supply unit 42 and the flow rate controller 43 to supply the liquid 101 to the front surface 100c of the substrate 100 at a predetermined flow rate.

Further, the controller 9 controls the flow rate controller unit 33 to stop the supply of the cooling gas 3a. Further, the controller 9 controls the driver unit 24b to set the rotation speed of the substrate 100 to a third rotation speed. The third rotation speed is, for example, 200 rpm to 700 rpm. When the rotation of the substrate 100 becomes faster, the liquid 101 may be scattered outwards by the centrifugal force. As a result, the liquid 101 may be discharged from the front surface 100c of the substrate 100. At this time, the contaminants separated from the front surface 100c of the substrate 100 are also discharged together with the liquid 101.

The supply amount of the liquid 101 is not particularly limited as long as the thawing is able to be implemented. Further, the rotation speed of the substrate 100 is not particularly limited as long as the liquid 101 and the contaminants are able to be discharged.

Next, the back surface cleaning step is performed as illustrated in FIGS. 3 and 4.

In the back surface cleaning step, as illustrated in FIG. 7, the controller 9 controls the driver unit 45 to move the liquid nozzle 44 to the retraction position outside the substrate 100. The controller 9 controls the driver unit 35 to move the cooling nozzle 34 to the retraction position outside the substrate 100. Then, the controller 9 controls the driver unit 55 to dispose the liquid nozzle 54 below substantially the center of the back surface 100b of the substrate 100.

Subsequently, as illustrated in FIG. 3, the controller 9 controls the supply unit 52 and the flow rate controller unit 53 to supply the liquid 102 to the back surface 100b of the substrate 100 at a predetermined flow rate. Further, the controller 9 controls the driver unit 24b to rotate the substrate 100 at a predetermined rotation speed.

At this time, the controller 9 may control the driver unit 55 to swing the liquid nozzle 54 that is ejecting the liquid 102, along the back surface 100b of the substrate 100. In this manner, the liquid 102 may be supplied to a wider region of the back surface 100b of the substrate 100, so that the back surface 100b of the substrate 100 may be more uniformly cleaned.

As an example, the flow rate of the liquid 102 is set to about 0.1 L/min to about 1.0 L/min, and the rotation speed of the substrate 100 is set to about 20 rpm to about 500 rpm. However, the present disclosure is not limited thereto. For example, the flow rate of the liquid 102, the rotation speed of the substrate 100, and the cleaning time may be appropriately changed according to, for example, the size of the substrate 100, the degree of contamination of the back surface 100b of the substrate 100, and the components of the liquid 102.

Next, the drying step is performed as illustrated in FIGS. 3 and 4.

In the drying step, the controller 9 controls the supply unit 52 and the flow rate controller unit 53 to stop the supply of the liquid 102. Subsequently, as illustrated in FIG. 8, the controller 9 controls the driver unit 55 to move the liquid nozzle 54 to the retraction position outside the substrate 100.

Then, the controller 9 controls the driver unit 24b to increase the rotation speed of the substrate 100 to a fourth rotation speed faster than the third rotation speed. When the rotation of the substrate 100 becomes faster, the substrate 100 may be dried quickly. The rotation speed of the substrate 100 is not particularly limited as long as the substrate 100 may be dried.

Next, the dried substrate 100 is carried out of the housing 6 through a carry-in/out port (not illustrated) of the housing 6 by a transfer device (not illustrated). In the carry-out step, as illustrated in FIG. 5, the controller 9 controls the driver unit 23b to move up the pusher 23a. When the pusher 23a moves up, the substrate 100 is lifted via the plurality of holding pins 22, so that the distance between the substrate 100 and the stage 21 increases. Thus, the substrate 100 may be easily transferred between a transfer device (not illustrated) and the placing unit 2.

In this way, the front surface 100c of the substrate 100 and the back surface 100b of the substrate 100 may be cleaned once. Each of the cleaning of the front surface 100c and the cleaning of the back surface 100b may be performed a plurality of times. In this case, the number of times of cleaning the front surface 100c and the number of times of cleaning the back surface 100b may be the same as or different from each other. Further, the series of steps described above may be performed a plurality of times.

As described above, when the cooling gas 3a is supplied to the back surface 100b of the substrate 100, the controller 9 may control the driver unit 35 to dispose the cooling nozzle 34 below the back surface 100b of the substrate 100, and control the driver unit 55 to move the liquid nozzle 54 to the retraction position of the liquid nozzle 54.

Further, when the liquid 102 is supplied to the back surface 100b of the substrate 100, the controller 9 may control the driver unit 55 to dispose the liquid nozzle 54 below the back surface 100b of the substrate 100, and control the driver unit 35 to move the cooling nozzle 34 to the retraction position of the cooling nozzle 34.

When the cooling gas 3a is supplied to the back surface 100b of the substrate 100, the controller 9 may control the driver unit 45 to dispose the liquid nozzle 44 above the front surface 100c of the substrate 100.

In this case, the controller 9 may control the driver unit 45 to swing the liquid nozzle 44 that is disposed above the front surface 100c of the substrate 100 and is ejecting the liquid 101, along the front surface 100c of the substrate 100.

Further, when the cooling gas 3a is supplied to the back surface 100b of the substrate 100, the controller 9 may control the driver unit 35 to swing the cooling nozzle 34 that is ejecting the cooling gas 3a, along the back surface 100b of the substrate 100.

Further, when the liquid 102 is supplied to the back surface 100b of the substrate 100, the controller 9 may control the driver unit 55 to swing the liquid nozzle 54 that is ejecting the liquid 102, along the back surface 100b of the substrate 100.

Figure 9:
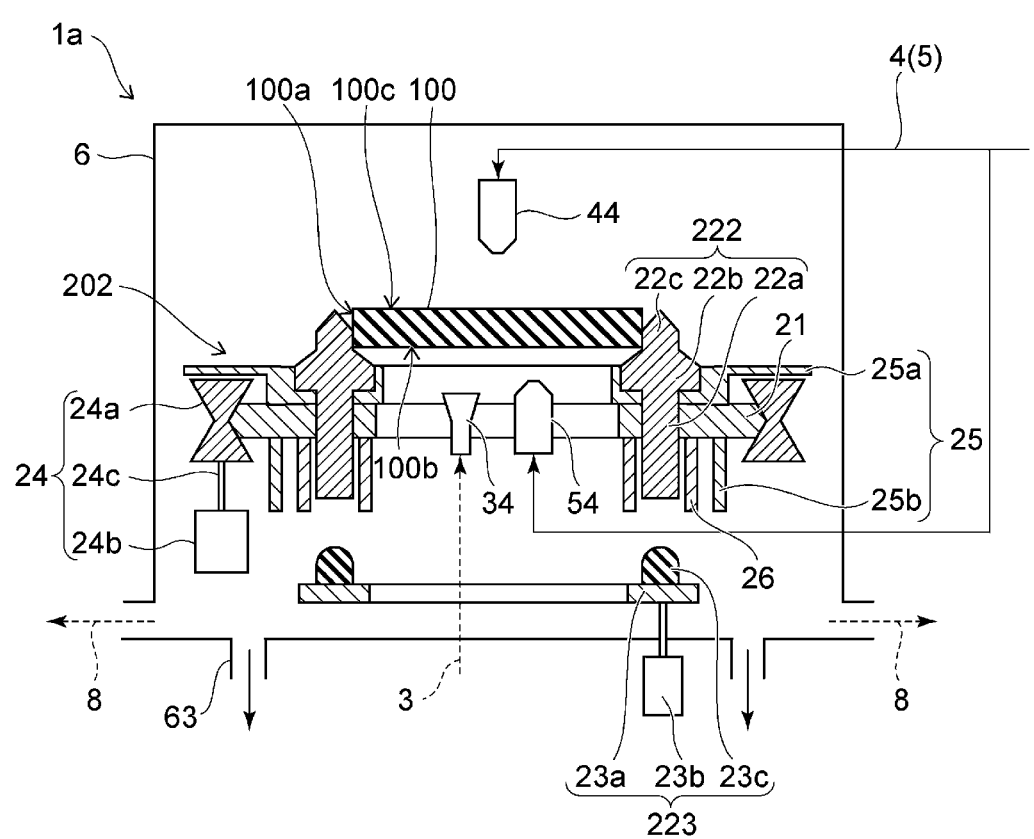
FIG. 9 is a schematic cross-sectional view illustrating a substrate processing apparatus according to another embodiment.

FIG. 9 is a schematic cross-sectional view illustrating a substrate processing apparatus 1a according to another embodiment.

Referring to FIG. 9, the substrate processing apparatus 1a includes a placing unit 202, a cooling unit 3, a first liquid supply unit 4, a second liquid supply unit 5, a housing 6, a blowing unit 7, an exhaust unit 8, and a controller 9.

In order to avoid the complication of illustration, FIG. 9 appropriately omits the illustration of the cooling unit 3, the first liquid supply unit 4, the second liquid supply unit 5, the blowing unit 7, the exhaust unit 8, and the controller 9.

Figure 10A:
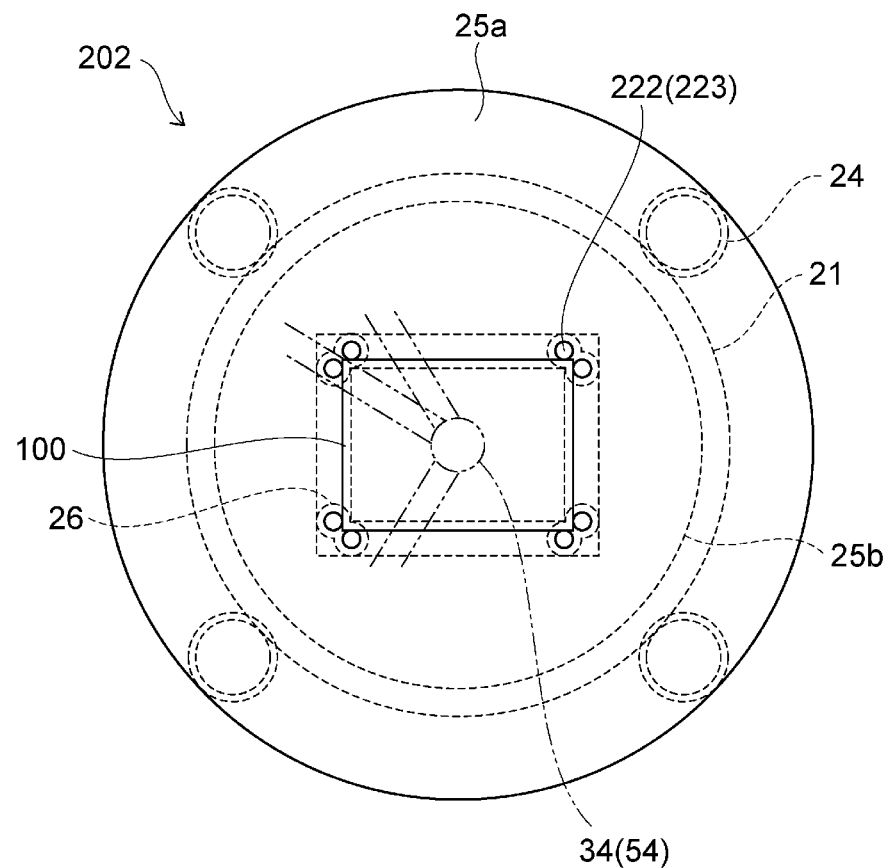
FIG. 10A is a schematic plan view of a placing unit.

FIG. 10A is a schematic plan view of the placing unit 202.

Figure 10B:
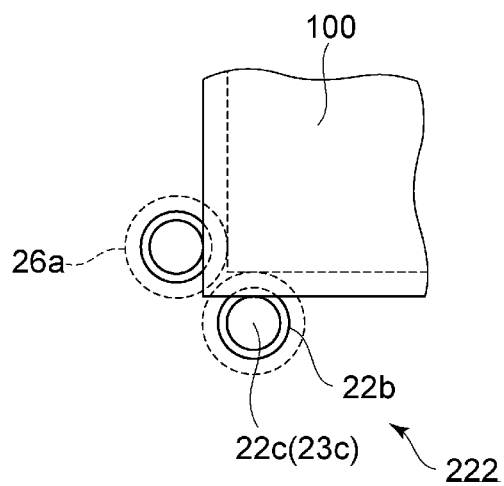
FIG. 10B is a schematic plan view of a holding pin cover according to yet another embodiment.

FIG. 10B is a schematic plan view of holding pin covers 26a according to another embodiment.

As illustrated in FIGS. 9 and 10A, the placing unit 202 includes a stage 21, a holding pin 222, an elevating unit 223, a rotating unit 24, a roller cover 25, and a holding pin cover 26.

The liquids 101 and 102 supplied to the substrate 100 flow on the upper surface of the stage 21, or on the lower surface of the stage 21 through a hole 21a, and are discharged from the peripheral edge of the stage 21 to the outside. However, the rotating unit 24 is provided on the peripheral edge of the stage 21, and a holding pins 22 is provided so as to penetrate the front surface and the back surface of the stage 21. Thus, the liquids 101 and 102 may adhere to at least one of the roller 24a, the support unit 24c, and the holding pins 22. The liquids 101 and 102 that adhere to at least one of the rollers 24a, the support unit 24c, and the holding pins 22 may be frozen by the cooling gas 3a supplied from the cooling unit 3 or the stage 21 cooled by the cooling gas 3a. Further, the liquids 101 and 102 on the upper surface or the lower surface of the stage 21 may be frozen and separated from the upper surface or the lower surface of the stage 21, and may collide with at least one of the rollers 24a, the support unit 24c, and the holding pins 22.

Thus, a roller cover 25 is provided in the placing unit 202 to suppress the liquids 101 and 102 from coming into contact with the roller 24a and the support unit 24c of the rotating unit 24, and the holding pin 222.

As illustrated in FIG. 9, the roller cover 25 includes, for example, an upper roller cover 25a and a lower roller cover 25b.

The upper roller cover 25a is a member that covers the vicinity of the peripheral edge of the upper surface of the stage 21, the upper surface of the roller 24a, and the side of the roller 24a that faces the stage 21. The upper roller cover 25a is provided on the upper surface of the stage 21. The upper roller cover 25a has, for example, a cylindrical shape with a flange formed at one end thereof. The diameter of the cylindrical portion of the upper roller cover 25a is smaller than the diameter of the stage 21 in order to prevent the contact with the roller 24a. The other end of the upper roller cover 25a comes into contact with the stage 21. Further, an opening may be formed in the upper roller cover 25a to correspond to the hole 21a of the stage 21. The opening may have the same shape and size as those of the hole 21a. Further, a hole may be formed in the upper roller cover 25a such that the guide 22a and the support unit 22b of the holding pin 222 are inserted through the hole. The holding pin 222 is provided to penetrate the upper roller cover 25a and the stage 21. Thus, the length of the guide 22a is longer than that of the holding pins 22.

The upper roller cover 25a may be formed of, for example, a metal such as stainless steel.

Further, the inside of the hole into which the guide unit 22a and the support unit 22b of the holding pin 222 are inserted may be coated with a liquid repellent material. Thus, even when the liquids 101 and 102 adhering to the holding pin 222 are frozen, the holding pin 222 may be easily separated from the upper roller cover 25a.

The upper roller cover 25a may be fixed to the stage 21 by using a fastening member such as a screw, or may be integrally formed with the stage 21.

As described above, the liquids 101 and 102 may flow from the hole 21a of the stage 21 to the lower surface of the stage 21, and adhere to the rollers 24a or the support unit 24c from the vicinity of the peripheral edge of the lower surface of the stage 21. The lower roller cover 25b suppresses the liquids 101 and 102 from adhering to the roller 24a and the support unit 24c.

The lower roller cover 25b has, for example, a cylindrical shape and covers the vicinity of the peripheral edge of the lower surface of the stage 21, the side of the roller 24a that faces the stage 21, and the side of the support 24c that faces the stage 21.

The lower roller cover 25b is provided near the peripheral edge of the lower surface of the stage 21. The diameter of the lower roller cover 25b is smaller than the diameter of the stage 21 in order to prevent the contact with the roller 24a.

The lower end of the lower roller cover 25b (the end opposite to the upper end that faces the stage 21) may be located below the lower end of the roller 24a. The lower end of the lower roller cover 25b may also be located below the lower end of the support unit 24c.

The lower roller cover 25b may be formed of, for example, a metal such as stainless steel.

The lower roller cover 25b may be fixed to the stage 21 by using a fastening member such as a screw, or may be integrally formed with the stage 21.

When the roller cover 25 is provided, the liquids 101 and 102 may be suppressed from being frozen in the vicinity of the peripheral edge of the stage 21 and on the roller 24a and the support unit 24c. Thus, the rotation of the stage 21 is not hindered by the freezing of the liquids 101 and 102.

As described above, the liquids 101 and 102 may flow from the hole 21a of the stage 21 to the lower surface of the stage 21. Further, the holding pin 222 is provided on the upper roller cover 25a so as to penetrate the stage 21 and the upper roller cover 25a. Thus, when the liquids 101 and 102 are frozen on the guide unit 22a, the holding pin 222 is not moved up and down. Thus, the placing unit 202 is provided with the holding pin cover 26.

The holding pin cover 26 is provided in the vicinity of the holding pin 222 on the lower surface of the stage 21. The holding pin cover 26 may be provided inside the lower roller cover 25b. The holding pin cover 26 covers the side surface of the guide 22a that protrudes from the lower surface of the stage 21. The holding pin cover 26 has a tubular shape and may be provided for each holding pin 222 (see, e.g., FIG. 10B).

Further, the holding pin cover 26 may be provided in the form of covering the plurality of holding pins 222. For example, as illustrated in FIG. 10A, when the holding pin cover 26 covers the side surfaces of the guides 22a of two adjacent holding pins 222, the holding pin cover 26 has a tubular shape with the cross section that appears to be two overlapping circles.

Further, the holding pin cover 26 may have a square annular convex portion provided inside the plurality of holding pins 222 and a square annular convex portion provided outside the plurality of holding pins 222.

For example, the annular convex portion provided inside the plurality of holding pins 222 is provided along the hole 21a of the stage 21. The annular convex portion provided outside the plurality of holding pins 222 has a shape similar to the annular convex portion provided inside the plurality of holding pins 222, and is provided to surround the plurality of holding pins 222 from the outside.

Further, as illustrated in FIG. 10B, the holding pin covers 26a may be provided for two adjacent holding pins 222, respectively, such that the holding pin covers 26a do not overlap with each other.

The holding pin cover 26 may be formed of, for example, a metal such as stainless steel.

The holding pin cover 26 may be fixed to the stage 21 by using a fastening member such as a screw, or may be integrally formed with the stage 21.

The lower end of the holding pin cover 26 (the end opposite to the upper end that faces the stage 21) is disposed below the lower end of the guide unit 22a. The lower end of the holding pin cover 26 is also disposed below the position of the ejection port of the cooling nozzle 34 when the cooling gas is supplied to the substrate 100, and below the position of the ejection port of the liquid nozzle 54 when the liquids 101 and 102 are supplied to the substrate 100.

When the holding pin cover 26 is provided, the liquids 101 and 102 may be suppressed from being frozen on the guide unit 22a.

On the upper surface of the stage 21, the guide unit 22a and the support unit 22b of the holding pin 222 are covered by the upper roller cover 25a. Thus, the freezing of the holding pin 222 may be suppressed by the upper roller cover 25a.

The elevating unit 223 includes a pusher 23a, a driver unit 23b, and a convex portion 23c.

The convex portion 23c has a columnar shape, and is provided in plural on the upper surface of the pusher 23a. The convex portion 23c is provided at the position that faces the guide unit 22a of the holding pin 222. The cross-sectional dimension of the convex portion 23c is smaller than the inner dimension of the holding pin cover 26. Thus, when the pusher 23a is moved up, the convex portion 23c may be inserted into the holding pin cover 26. When the convex portion 23c is inserted into the holding pin cover 26, the convex portion 23c may push the lower end of the guide unit 22a inside the holding pin cover 26.

The controller 9 monitors the rotation position of the stage 21. Thus, when the controller 9 stops the rotation of the stage 21, the controller 9 makes the holding pin 222 arrive at the position that faces the convex portion 23c.

As described above, when the roller cover 25 and the holding pin cover 26 are provided, the liquids 101 and 102 may be suppressed from adhering to the rollers 24a and the holding pin 222 in the preliminary step, the liquid film forming step, the thawing step, and the back surface cleaning step. Thus, the freezing of the rollers 24a and the holding pin 222 may be suppressed.

In the carry-in/out step of the substrate 100, the liquid film forming step, and the cooling step, the rotation of the stage 21 may be stopped. When the rotation of the stage 21 is stopped, the liquids 101 and 102 tend to stay on the stage 21. Thus, when the rotation of the stage 21 is stopped, the rollers 24a and the holding pin 222 are likely to be frozen. When the roller cover 25 and the holding pin cover 26 are provided, the roller 24a and the holding pin 222 may be suppressed from being frozen even when the rotation of the stage 21 is stopped.

Further, the liquids 101 and 102 frozen on the surface of the stage 21 may be suppressed from being separated from the surface of the stage 21 and colliding with the rollers 24a to hinder the rotation of the stage 21.

Figure 11:
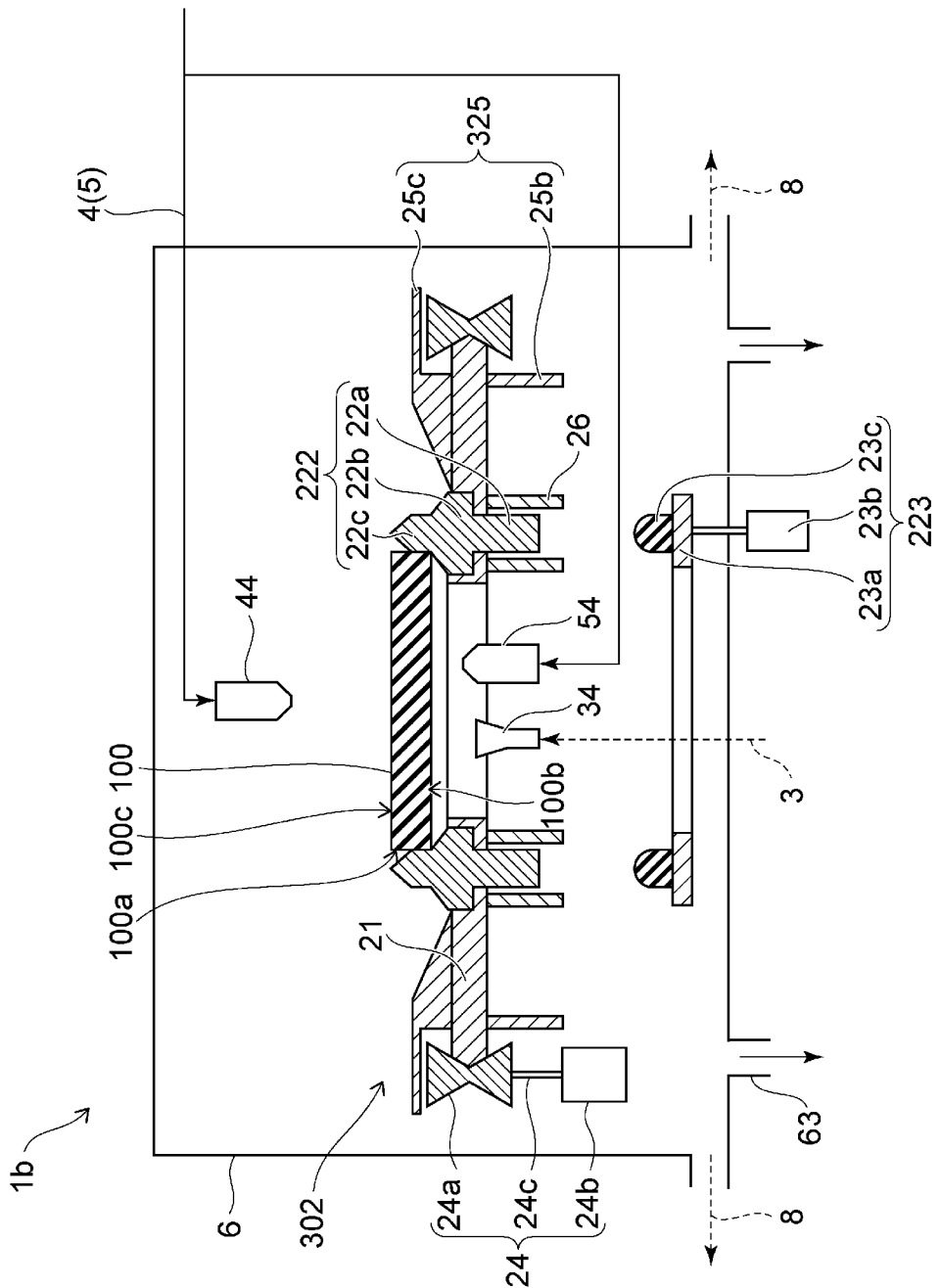
FIG. 11 is a schematic cross-sectional view illustrating a substrate processing apparatus according to yet another embodiment.

FIG. 11 is a schematic cross-sectional view illustrating a substrate processing apparatus 1b according to yet another embodiment.

Referring to FIG. 11, the substrate processing apparatus 1b includes a placing unit 302, a cooling unit 3, a first liquid supply unit 4, a second liquid supply unit 5, a housing 6, a blowing unit 7, an exhaust unit 8, and a controller 9.

In order to avoid complication, FIG. 11 appropriately omits the illustration of the cooling unit 3, the first liquid supply unit 4, the second liquid supply unit 5, the blowing unit 7, the exhaust unit 8, and the controller 9.

As illustrated in FIG. 11, the placing unit 302 includes a stage 21, a holding pin 222, an elevating unit 223, a rotating unit 24, a roller cover 325, and a holding pin cover 26.

The roller cover 325 includes, for example, an upper roller cover 25c and a lower roller cover 25b.

The upper roller cover 25c is provided near the peripheral edge of the upper surface of the stage 21. The upper roller cover 25c covers the vicinity of the peripheral edge of the upper surface of the stage 21, the upper surface of the roller 24a, and the side of the roller 24a that faces stage 21. The upper roller cover 25c is provided outside the holding pin 222. The upper roller cover 25c has, for example, a cylindrical shape, and has a shape in which the outer edge side of the upper end projects outward from the roller 24a. Further, the thickness of the upper roller cover 25c on the inner edge side is smaller than the thickness on the outer edge side. Thus, the inner edge of the upper roller cover 25c expands in diameter from the lower end to the upper end. That is, the end on the inner edge side is formed so as to be an inclined surface from the upper end on the outer edge side to the lower end on the inner edge side. Thus, the upper surface of the upper roller cover 25c has a surface parallel to the surface of the stage 21 and an inclined surface.

The upper roller cover 25c may be formed of, for example, a metal such as stainless steel.

The upper roller cover 25c may be fixed to the stage 21 by using a fastening member such as a screw, or may be integrally formed with the stage 21.

Similarly to the roller cover 25 and the holding pin cover 26 described above, when the roller cover 325 and the holding pin cover 26 are provided, the roller 24a and the holding pin 222 may be suppressed from being frozen even when the rotation of the stage 21 is stopped. Further, the liquids 101 and 102 frozen on the surface of the stage 21 may be suppressed from being separated from the surface of the stage 21 and colliding with the rollers 24a to hinder the rotation of the stage 21.

Further, the thickness of the upper roller cover 25c on the inner edge side is smaller than the thickness on the outer edge side. Thus, the upper surface of the upper roller cover 25c has an inclined surface. When the upper surface of the upper roller cover 25c has an inclined surface that inclines from the hole 21a toward the roller 24a, the liquid 101 inside the upper roller cover 25c is easily discharged to the outside of the upper roller cover 25c by the centrifugal force.

Further, the weight may be reduced as compared with the upper roller cover 25a.

Figure 12:
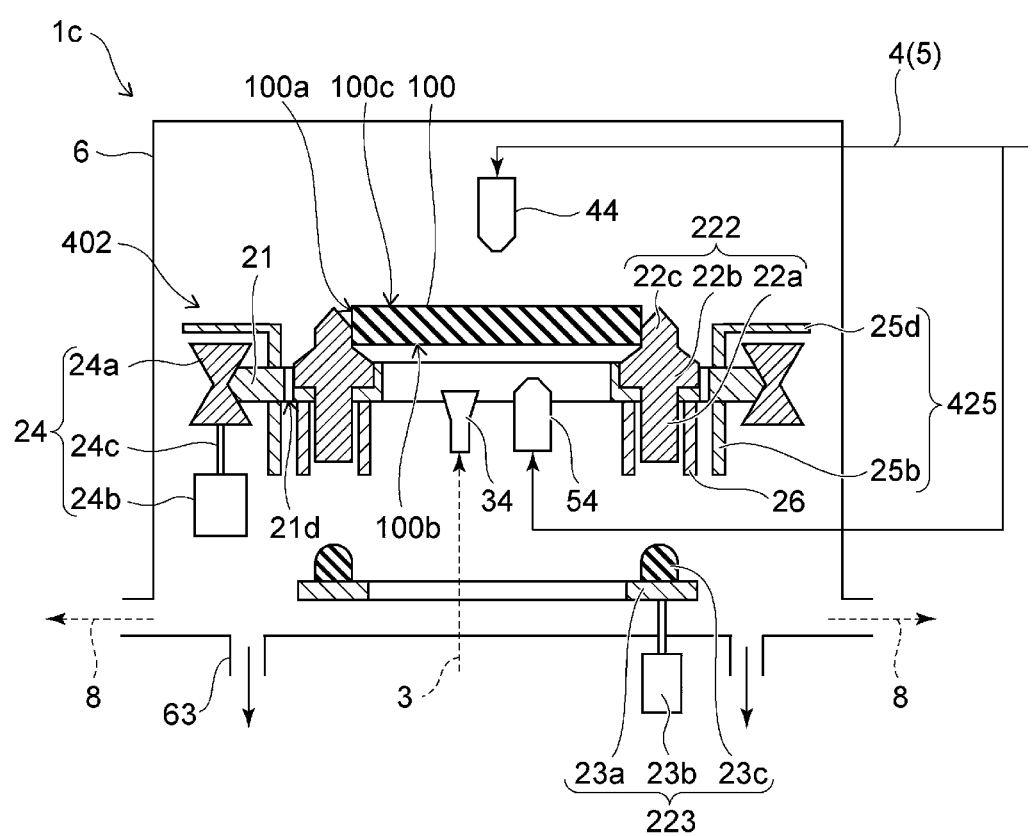
FIG. 12 is a schematic cross-sectional view illustrating a substrate processing apparatus according to yet another embodiment.

FIG. 12 is a schematic cross-sectional view illustrating a substrate processing apparatus 1c according to yet another embodiment.

Referring to FIG. 12, the substrate processing apparatus 1c includes a placing unit 402, a cooling unit 3, a first liquid supply unit 4, a second liquid supply unit 5, a housing 6, a blowing unit 7, an exhaust unit 8, and a controller 9.

In order to avoid complication, FIG. 12 appropriately omits the illustration of the cooling unit 3, the first liquid supply unit 4, the second liquid supply unit 5, the blowing unit 7, the exhaust unit 8, and the controller 9.

Figure 13A:
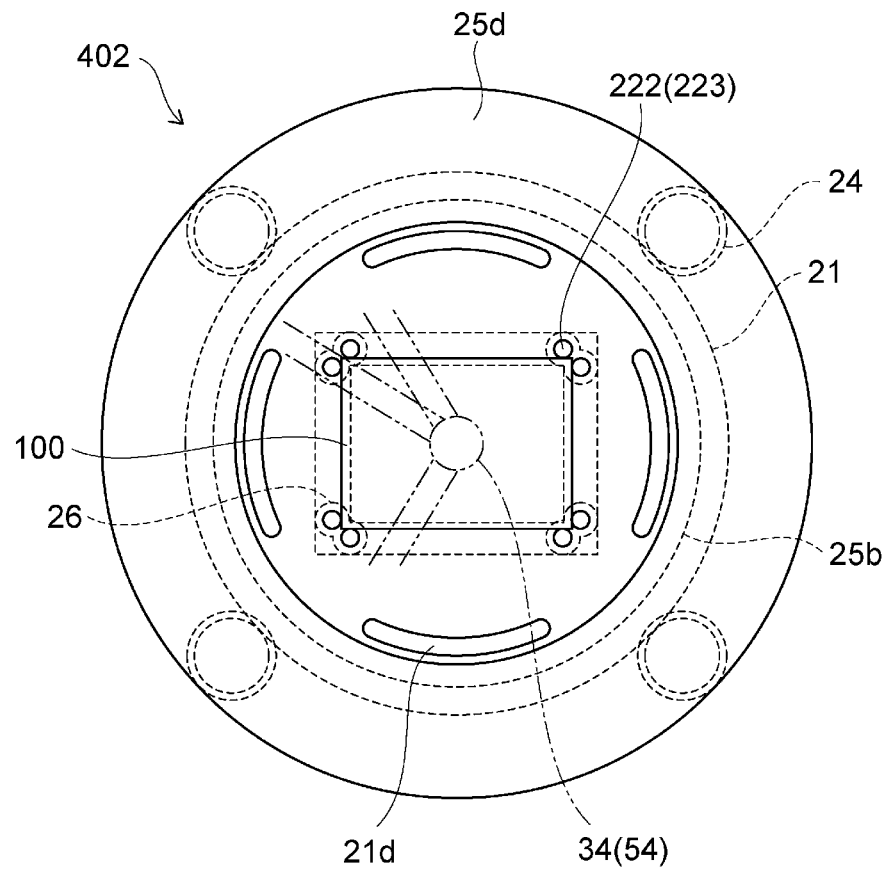
FIG. 13A is a schematic plan view of a placing unit.

FIG. 13A is a schematic plan view of the placing unit 402.

Figure 13B:
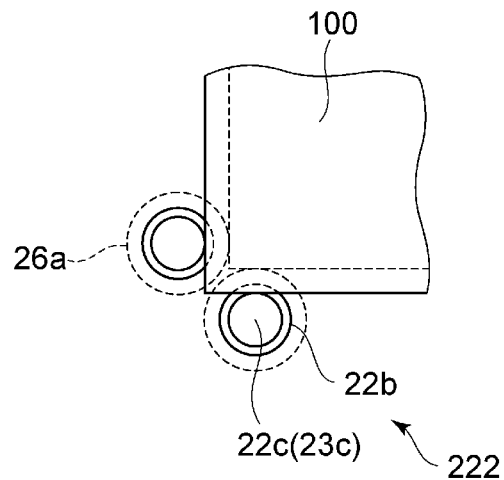
FIG. 13B is a schematic plan view of a holding pin cover according to yet another embodiment.

FIG. 13B is a schematic plan view of holding pin covers 26a according to another embodiment.

As illustrated in FIGS. 12 and 13A, the placing unit 402 includes a stage 21, a holding pin 222, an elevating unit 223, a rotating unit 24, a roller cover 425, and a holding pin cover 26.

The roller cover 425 includes, for example, an upper roller cover 25d and a lower roller cover 25b.

The upper roller cover 25d is provided near the peripheral edge of the upper surface of the stage 21. The upper roller cover 25d covers the vicinity of the peripheral edge of the upper surface of the stage 21, the upper surface of the roller 24a, and the side of the roller 24a that faces the stage 21. The upper roller cover 25d has, for example, a cylindrical shape, and includes a plate-like body at the upper end, which projects outward from the stage 21. The plate-like body covers the upper surface of the roller 24a. The upper roller cover 25d is provided outside the holding pin 222.

The upper roller cover 25d may be formed of, for example, a metal such as stainless steel.

The upper roller cover 25d may be fixed to the stage 21 by using a fastening member such as a screw, or may be integrally formed with the stage 21.

Similarly to the roller cover 25 and the holding pin cover 26 described above, when the roller cover 425 and the holding pin cover 26 are provided, the roller 24a and the holding pin 222 may be suppressed from being frozen even when the rotation of the stage 21 is stopped.

As described above, the upper roller cover 25d has a cylindrical shape, and includes a plate-like body at the upper end, which projects outward from the stage 21. The plate-like body covers the upper surface of the roller 24a.

With the configuration, the weight of the upper roller cover 25d may be reduced as compared with the upper roller covers 25a and 25c.

Further, the stage 21 may be provided with at least one hole 21d. The hole 21d penetrates between the upper surface and the lower surface of the stage 21. The end of the hole 21d close to the upper surface of the stage 21 is opened near the inner side surface of the upper roller cover 25d. The end of the hole 21d close to the lower surface of the stage 21 is opened between the lower roller cover 25b and the holding pin cover 26.

When the hole 21d is provided, the liquid 101 inside the upper roller cover 25d may be discharged below the stage 21. In this case, since the liquid 101 is discharged between the lower roller cover 25b and the holding pin cover 26, the discharged liquid 101 may be suppressed from adhering to the rollers 24a and the support 24c.

Further, similarly to the roller cover 25 and the holding pin cover 26 described above, even though the rotation of the stage 21 is stopped, the rollers 24a and the holding pin 222 may be suppressed from being frozen. Further, the liquids 101 and 102 frozen on the surface of the stage 21 may be suppressed from being separated from the surface of the stage 21 and colliding with the rollers 24a to hinder the rotation of the stage 21.

Further, as illustrated in FIG. 13A, the holding pin cover 26 of the present embodiment has a cross section that appears to be two overlapping circles in order to cover the side surfaces of the guides 22a of the two adjacent holding pins 222.

Further, as illustrated in FIG. 13B, holding pin covers 26a are provided for each of the two adjacent holding pins 222, so that the holding pin covers 26a do not overlap with each other.

For example, the shapes, the dimensions, the number, and the arrangement of the respective components provided in the substrate processing apparatus 1 are not limited to the examples described herein, and may be appropriately changed.

For example, while the foregoing embodiments describe the coolant unit 31 that generates the cooling gas 3a by vaporizing the coolant, the coolant unit may cool a gas of room temperature through a chiller circulation.

For example, the thawing step may be performed before cracks are generated in the frozen film in the freezing step (solid phase).

For example, the thawing step may be performed after the freezing step (solid-liquid phase) without performing the freezing step (solid phase).

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a stage having a substantially disc-shaped form and including a hole in a center thereof;
   a roller configured to contact a side surface of the stage and rotate the stage;
   a plurality of holding pins provided on the stage and configured to hold a substrate;

a first liquid nozzle configured to supply a first liquid to a first surface of the substrate opposite to a side that faces the stage;

a first driver configured to move a position of the first liquid nozzle;

a second liquid nozzle configured to supply a second liquid from the hole of the stage to a second surface of the substrate on the side that faces the stage;

a second driver configured to move a position of the second liquid nozzle;

a cooling nozzle configured to supply a cooling gas from the hole of the stage to the second surface of the substrate;

a third driver configured to move a position of the cooling nozzle; and a controller configured to control the first driver, the second driver, and the third driver, wherein, when the cooling gas is supplied to the second surface of the substrate, the controller controls the third driver to dispose the cooling nozzle below the second surface of the substrate, and controls the second driver to move the second liquid nozzle to a retracted position of the second liquid nozzle, or when the second liquid is supplied to the second surface of the substrate, the controller controls the second driver to dispose the second liquid nozzle below the second surface of the substrate, and controls the third driver to move the cooling nozzle to a retracted position of the cooling nozzle.

2. The substrate processing apparatus according to claim 1, wherein the stage includes a plurality of second holes that penetrates the stage in a thickness direction, each of the plurality of holding pins is provided inside the second holes, and are provided with a guide that protrudes from a side of the stage opposite to a side where the substrate is disposed, so as to be movable individually along a direction orthogonal to the first surface, and the substrate processing apparatus further comprises an elevator provided separately from the plurality of holding pins and configured to contact with or separate from the guides of the plurality of holding pins, thereby collectively moving the plurality of holding pins in a direction orthogonal to the first surface of the substrate.

3. The substrate processing apparatus according to claim 2, wherein the cooling nozzle and the second liquid nozzle move between ends of the guides of the holding pins and the elevator.

4. The substrate processing apparatus according to claim 3, wherein, when the cooling gas is supplied to the second surface of the substrate, the controller controls the first driver to dispose the first liquid nozzle above the first surface of the substrate.

5. The substrate processing apparatus according to claim 4, wherein the controller controls the first driver to swing the first liquid nozzle that is disposed above the first surface of the substrate and ejects the first liquid, along the first surface of the substrate.

6. The substrate processing apparatus according to claim 4, wherein, when the cooling gas is supplied to the second surface of the substrate, the controller controls the third driver to swing the cooling nozzle that ejects the cooling gas, along the second surface of the substrate.

7. The substrate processing apparatus according to claim 5, wherein, when the cooling gas is supplied to the second surface of the substrate, the controller controls the third driver to swing the cooling nozzle that ejects the cooling gas, along the second surface of the substrate.

8. The substrate processing apparatus according to claim 6, wherein, when the second liquid is supplied to the second surface of the substrate, the controller controls the second driver to swing the second liquid nozzle that ejects the second liquid, along the second surface of the substrate.

9. The substrate processing apparatus according to claim 7, wherein, when the second liquid is supplied to the second surface of the substrate, the controller controls the second driver to swing the second liquid nozzle that ejects the second liquid, along the second surface of the substrate.

10. The surface processing apparatus according to claim 9, wherein the cooling nozzle has a tapered portion in which an inner diameter gradually increases toward the side of the substrate and an angle of the tapered portion is larger than 0° and 8° or less.

11. The substrate processing apparatus according to claim 4, further comprising:

an upper roller cover provided on a surface of the stage on a side where the substrate is disposed and configured to cover an upper surface of the roller and a side of the roller that faces the stage.

12. The substrate processing apparatus according to claim 10, further comprising:

an upper roller cover provided on a surface of the stage on a side where the substrate is disposed and configured to cover an upper surface of the roller and a side of the roller that faces the stage.

13. The substrate processing apparatus according to claim 11, wherein the upper roller cover includes holes into which the plurality of holding pins are inserted.

14. The substrate processing apparatus according to claim 12, wherein the upper roller cover includes holes into which the plurality of holding pins are inserted.

15. The substrate processing apparatus according to claim 12, wherein the upper roller cover has a cylindrical shape in which an outer edge side of an upper end projects outward from the roller, and an end of the upper roller cover on an inner edge side is formed so as to be an inclined surface from the upper end on the outer edge side of the end to a lower end on the inner edge side.

16. The substrate processing apparatus according to claim 12, wherein the upper roller cover has a cylindrical shape and includes a plate-like body that projects outward from the stage, at the upper end, and the plate-like body covers the upper surface of the roller.

17. The substrate processing apparatus according to claim 11, further comprising:

a lower roller cover provided near a peripheral edge of the surface of the stage opposite to the side where the substrate is disposed and configured to cover a side of the roller that faces the stage.

18. The substrate processing method according to claim 12, further comprising:

a lower roller cover provided near a peripheral edge of the surface of the stage opposite to the side where the substrate is disposed and configured to cover a side of the roller that faces the stage.

19. The substrate processing apparatus according to claim 17, further comprising:

a holding pin cover provided on the surface of the stage opposite to the side where the substrate is disposed and configured to cover a side surface of the guide of each of the plurality of holding pins that protrudes from the surface of the stage opposite to the side where the substrate is disposed, wherein the elevator further includes a convex portion provided at a position facing the guide.

20. The substrate processing apparatus according to claim 18, further comprising:

a holding pin cover provided on the surface of the stage opposite to the side where the substrate is disposed and configured to cover a side surface of the guide of each of the plurality of holding pins that protrudes from the side of the stage opposite to the side where the substrate is disposed, wherein the elevator further includes a convex portion provided at a position facing the guide.

* * * * *